US006717267B1

(12) United States Patent
Kunikiyo

(10) Patent No.: US 6,717,267 B1
(45) Date of Patent: Apr. 6, 2004

(54) SEMICONDUCTOR DEVICE HAVING MULTILAYER INTERCONNECTION STRUCTURE

(75) Inventor: Tatsuya Kunikiyo, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 3 days.

(21) Appl. No.: 09/612,298

(22) Filed: Jul. 7, 2000

(30) Foreign Application Priority Data

Jan. 13, 2000 (JP) ...................................... P2000-004266

(51) Int. Cl.[7] .......................... H01L 23/48; H01L 23/52; H01L 29/40
(52) U.S. Cl. ......................... 257/758; 257/760; 438/926
(58) Field of Search ................................. 257/758, 760, 257/775; 438/926

(56) References Cited

U.S. PATENT DOCUMENTS

| 5,441,915 A | * | 8/1995 | Lee | 257/211 |
| 5,729,047 A | * | 3/1998 | Ma | 257/664 |
| 5,811,352 A | * | 9/1998 | Numata et al. | 438/622 |

FOREIGN PATENT DOCUMENTS

| JP | 4-179126 | 6/1992 |
| JP | 8-222632 | 8/1996 |
| JP | 10-199882 | 7/1998 |

OTHER PUBLICATIONS

T. Udea, et al., 1999 Symposium on VLSI Technology Digest of Technical Papers, pps. 111–112, "Integration of 3 Level Air Gap Interconnect for Sub–Quarter Micron CMOS," 1999.

S. Takahashi, et al., IEDM 98, pps. 833–836, "Interconnect Design Strategy; Structure's, Repeaters and Materials Toward 0.1μm ULSIs with a Giga–Hertz Clock Operations," 1998.

* cited by examiner

Primary Examiner—Phat X. Cao
(74) Attorney, Agent, or Firm—Oblon, Spivak, McClelland, Maier & Neustadt, P.C.

(57) ABSTRACT

A semiconductor device which reduces a noise superimposed upon a signal carried on an interconnection or crosstalk. Dummy interconnections are formed in the same layers respectively as interconnections formed in a plurality of layers. The dummy interconnections are connected through dummy plugs. At least the dummy interconnections and the dummy plugs are fixed at a ground potential and barrier layers are formed between the same layers and at least one of the conductive interconnections, the conductive dummy interconnections and the conductive dummy plug.

11 Claims, 34 Drawing Sheets

|    | INTERCONNECTION 19C | DUMMY INTERCONNECTIONS 21A, 21B |
|----|---------------------|----------------------------------|
| 1  | VDD                 | VDD                              |
| 2  | VDD                 | VSS                              |
| 3  | VDD                 | VBB                              |
| 4  | VPC                 | VPC                              |
| 5  | VPC                 | VSS                              |
| 6  | VPC                 | VBB                              |
| 7  | VSS                 | VDD                              |
| 8  | VSS                 | VSS                              |
| 9  | VSS                 | VBB                              |
| 10 | VBB                 | VDD                              |
| 11 | VBB                 | VSS                              |
| 12 | VBB                 | VBB                              |
| 13 | VSIG                | VDD                              |
| 14 | VSIG                | VPC                              |
| 15 | VSIG                | VSS                              |
| 16 | VSIG                | VBB                              |

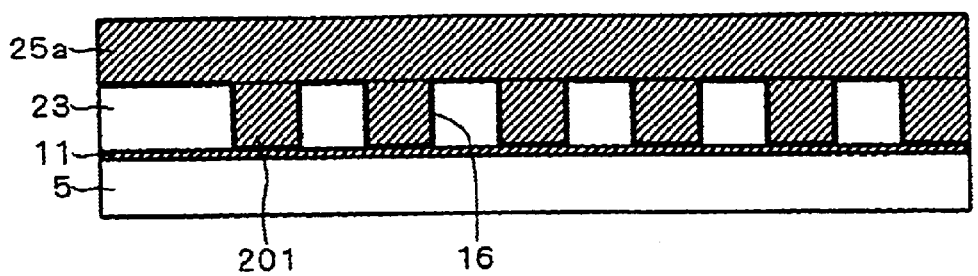
F I G. 20
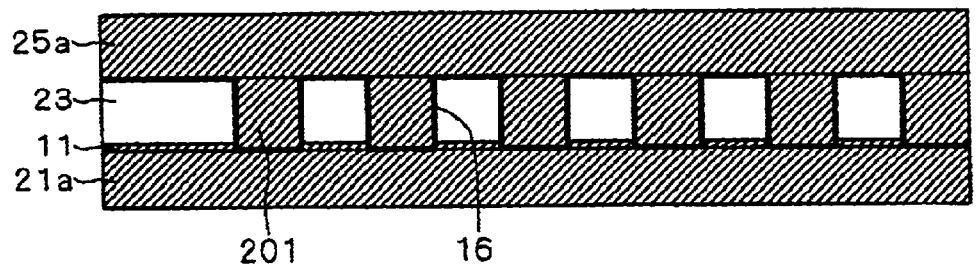
F I G. 21

SEMICONDUCTOR DEVICE HAVING MULTILAYER INTERCONNECTION STRUCTURE

BACKGROUND OF THE INVENTION

1. Field of the Invention

The present invention relates to a semiconductor device having a multi-layered interconnection structure in which interconnections are formed in a plurality of layers over the main surface of a semiconductor substrate, and particularly to an improvement for reducing the noise superimposed on the signals transmitted through the interconnections or cross-talk.

2. Description of the Background Art

Semiconductor integrated circuits represented by the LSIs (Large Scale Integrated circuits) have a large number of semiconductor elements formed in active regions in the main surface of semiconductor substrates. These semiconductor devices are electrically isolated from each other by element isolation structure such as STI (Shallow Trench Isolation). The semiconductor elements are selectively connected through electric conductors (interconnections) to realize the function of an integrated circuit.

Usually, polysilicon which contains a dopant at a high concentration or metal is used as the material of the electric conductor. Used as the metal interconnections are aluminum, copper, tungsten, molybdenum, etc. The gate structure, which is an interconnection formed in close proximity to the main surface of the semiconductor substrate, is formed by using aluminum, polysilicon, polysilicon/metal silicide double-layer structure, tungsten, molybdenum, etc. Metals such as tungsten, cobalt, nickel, titanium, zirconium, platinum, etc. are used for the metal silicide.

Two methods have conventionally been suggested as methods for forming the interconnections. In a first method, an interconnection material is deposited over the entire main surface of a semiconductor substrate by CVD (Chemical Vapor Deposition), sputtering, etc. and then a resist is applied. Then it is patterned through a transfer process to form a resist mask. The interconnection material is then anisotropically etched by using the resist mask to form an interconnection pattern. This first method is referred to as "etching method" in this specification.

In a second method, a resist is applied on an insulating film formed on the main surface of a semiconductor substrate and the resist is patterned through a transfer process to form a resist mask. Then an anisotropic etching is performed by using this resist mask to selectively form trenches in the insulating film. Next the trenches are filled with an interconnection material by using CVD or deposition. Subsequently, the surface is smoothed out by CMP (Chemical Mechanical Polishing) so that the surface of the insulating film and the surface of the interconnection material approximately coincide with each other. This second method is referred to as damascene method.

First, an interconnection formation process by the etching method will be described. FIGS. 27 to 29 are manufacture process diagrams showing a conventional interconnection formation process by the etching method.

The process shown in FIG. 27 is performed first. In the process of FIG. 27, first, STIs 102 as the element isolation structure and MOSFETs as semiconductor elements are formed on the main surface of the semiconductor substrate 101 which is a silicon substrate. Each MOSFET has a pair of $N^+$ source/drain regions (a set of a source region and a drain region is referred to as "source/drain regions" together) 106, a pair of $N^-$ source/drain regions 105 and a channel region 104, which are regions selectively formed in the main surface of the semiconductor substrate 101. A gate electrode having a double-layer structure of a doped polysilicon layer 108 and a tungsten silicide layer 109 is selectively formed on the main surface, which faces to the channel region 104 through a gate insulating film 107. Further, the gate electrode is covered by sidewalls 111 with a silicon oxynitride film 110 interposed therebetween.

The STIs 102 are selectively formed in the main surface of the semiconductor substrate 101 to electrically separate adjacent MOSFETs. A channel stopper layer 103 is formed in the semiconductor substrate 101 prior to the formation of the MOSFETs.

After the formation of the MOSFETs and STIs 102, an interlayer insulating film 112 is deposited over the main surface of the semiconductor substrate 101 so thick as to cover the sidewalls 111. Next, through holes 113 are selectively formed in the interlayer insulating film 112 right above the $N^+$ source/drain regions 106, and aluminum 114 is deposited to fill the through holes 113 and to cover the interlayer insulating film 112. The aluminum plugs buried in the through holes 113 function as the source/drain electrodes of the MOSFETs.

The aluminum 114 may precipitate on the semiconductor substrate 101 to cause leakage, since the semiconductor substrate 101 is exposed in the bottoms of the through holes 113. To prevent this, a barrier metal layer (not shown) is deposited on the bottoms and sides of the through holes 113. TiN (titanium nitride) is used as the material of the barrier metal layer, for example.

Next, an ARC film (Anti Reflection Coating) 115 is deposited on the aluminum 114. The ARC film 115 is deposited to prevent so-called halation in which exposure light used in a transfer process is reflected at the surface of the aluminum 114 to cause the resist pattern to be formed thinner than the designed form. Subsequently, a resist is applied on the ARC film 115 and a resist mask 116 is formed through a transfer process.

Next, the process shown in FIG. 28 is performed. In the process of FIG. 28, first, an anisotropic etching is applied to the aluminum 114 by using the resist mask 116 to form aluminum interconnections 150. An interlayer insulating film 117 is then deposited. At this time, along the main surface of the semiconductor substrate 101, while a small step height 120 appears on the surface of the interlayer insulating film 117 in the area 118 where the density of the aluminum interconnections 150, or the interconnection density, is high, a large step height 121 appears in the area 119 where the interconnection density is low. Such a large difference in level like the step height 121 causes problems in the later processes; this degrades the accuracy of patterning by transfer in the process of depositing aluminum on the interlayer insulating film 117 and forming a second aluminum interconnection through a transfer process, for example.

In order to avoid this problem, the interlayer insulating film 117 may be smoothed by CMP prior to the deposition of aluminum on the interlayer insulating film 117. However, due to the uneven interconnection density, the CMP process cannot sufficiently smooth the nonuniform topography on the surface of the interlayer insulating film 117.

A method for avoiding this problem is known, where, as shown in FIG. 29, dummy aluminum interconnections 122 which do not contribute to the operation of the MOSFETs are formed to fill the intervals between the less densely arranged aluminum interconnections 150 so as to compensate for the unevenness of the interconnection density. This method avoids the formation of areas with less densely arranged interconnections and reduces the step height 123 appearing on the surface of the interlayer insulating film 117, thus enhancing the flatness of the surface of the interlayer insulating film 117 after CMP. In this way, the formation of the dummy interconnection pattern is considered to be essential to obtain improved flatness on the surface of the structure formed after CMP above the semiconductor substrate 101.

Next, an interconnection formation process by the damascene method will be described. A technique for enhancing the operating speed of LSIs is known, where copper (Cu), which has lower interconnection resistance than aluminum (Al), is used as the interconnection material in the LSIs. For example, at 20° C., Cu has a resistivity of as low as 1.70 $\mu\Omega$.cm while that of Al is 2.74 $\mu\Omega$.cm. However, since it is difficult to form copper interconnections by the above-described etching method, the damascene method is widely adopted in the process of forming copper interconnections.

FIGS. 30 to 36 are manufacture process diagrams showing a conventional interconnection formation process by the damascene method. First, as shown in FIG. 30, STIs 102 as element isolation structure and MOSFETs as semiconductor elements are formed on the main surface of the semiconductor substrate 101 which is a silicon substrate. As to the structure of the MOSFETs, the MOSFETs shown in FIG. 30 have the same structure as the MOSFETs shown in FIG. 27 except that they each have a silicide layer 145 on the N$^+$ source/drain regions 106.

After the formation of the MOSFETs and STIs 102, an interlayer insulating film 127 is deposited over the main surface of the semiconductor substrate 101 so thick as to cover the sidewalls 111. Next, through holes 124 are selectively formed in the interlayer insulating film 127 right above the N$^+$ source/drain regions 106. In this stage of process, the interconnection trenches 125 shown in FIG. 30 are not formed yet. An insulating film having a relative dielectric constant of about two to three is used as the interlayer insulating film 127, for example. While a silicon oxide film has a relative dielectric constant of about 3.9, an insulating film having a lower relative dielectric constant is used to reduce the parasitic capacitance between adjacent gate electrodes or between the gate electrodes and plugs buried in the through holes 124 so as to enhance the operating speed of the semiconductor device.

Next, resist plugs (not shown) are deposited to fill the through holes 124. Subsequently a resist mask is formed and anisotropic etching is applied to the interlayer insulating film 127 to form interconnection trenches 125. This process may form an area 129 in which the interconnection trenches 125 are formed densely and an area 130 in which they are formed less densely.

Subsequently, the resist plugs filling the through holes 124 are removed and a barrier metal 126 is deposited to cover the bottoms and sides of the through holes 124, the bottoms and sides of the interconnection trenches 125, and the upper surface of the interlayer insulating film 127. A film of metal nitride such as WN, TiN, TaN etc. is used as the material of the barrier metal 126. The barrier metal 126 is formed to prevent the metal atoms in the through holes 124 and the interconnection trenches 125 from thermally diffusing into the interlayer insulating film 127.

In the next process shown in FIG. 31, copper is deposited by CVD, PVD (Physical Vapor Deposition) etc to fill the through holes 124 and the interconnection trenches 125 and to cover the top surface of the interlayer insulating film 127. At this time, while a small step height 132 may appear on the surface of the deposited copper in the high interconnection density area 129, a large step height 133 may appear in the low interconnection density area 130. When the step heights are nonuniform in this way, it is difficult to obtain a sufficiently flat surface even after planarization in the later CMP process.

A method for avoiding this problem is known, where, as shown in FIG. 32, dummy interconnection trenches 134 are formed in the low interconnection density area 130, or large interconnection interval area, to reduce the unevenness of the interconnection intervals. This reduces the irregularities appearing on the surface of the deposited copper so that the topography becomes uniform in the area 129 and area 130.

When copper is deposited by using electroplating apparatus, the nonuniform step heights 132 and 133 on the copper surface as shown in FIG. 31 can be reduced fairly well. However, the nonuniform interconnection density still causes the copper interconnections to be over-polished in the lower interconnection density area 130 in the CMP process. This phenomenon is called "dishing" because observation of the section of an over-polished copper interconnection shows that the top surface of the copper is dented just like the bottom of a dish.

As the interconnection density becomes higher, a larger amount of copper must be removed per unit area, which reduces the polishing rate. Accordingly, the polishing rate is larger in the low interconnection density area 130 than in the high density area 129. Hence, when priority is given to the flatness of the high density area 129, then the copper interconnections in the low density area 130 will be over-polished to cause the dishing. When dishing occurs in a copper interconnection, the cross-sectional area of the copper interconnection is reduced to increase the interconnection delay. That is to say, the operating speed of the semiconductor device is lowered. Avoiding the dishing problem, too, requires the formation of dummy interconnections to make the interconnection density more uniform. This enhances the flatness of the copper interconnections at the same time.

In the next process step shown in FIG. 33, first, CMP is applied to smooth the top surface of copper using the interlayer insulating film 127 as the stopper. This CMP process smoothes the surface so that the top surface of the interlayer insulating film 127 and the top surface of the copper interconnections approximately coincide with each other. In this process, the barrier metal 126 formed on the upper surface of the interlayer insulating film 127 is also removed. The interconnections 125b and the dummy interconnections 134b are formed in this process step. FIG. 33 shows the two kinds of interconnections with different types of hatching so that they can be clearly distinguished, though both are made of the same material, copper.

Next, interlayer insulating films 135 and 136 are deposited. For the material of the interlayer insulating film 135, silicon nitride or silicon oxynitride is used, for example. The interlayer insulating film 135 is formed for the purpose of preventing oxidation of the exposed surface of the copper interconnections. Silicon nitride and silicon oxynitride have the property of preventing oxidizing agent (oxygen, water, etc.) in the air or in the gas atmosphere used in semiconductor device manufacturing apparatus from thermally diffusing or drifting to reach the copper interconnections. For the material of the interlayer insulating film 136, an insulator having a relative dielectric constant of about two to three is used, for example. An insulator having a relatively small relative dielectric constant is used for the interlayer insulating film 136 to reduce the capacitance between interconnections so as to shorten the delay time during the operation of the semiconductor device.

Next, anisotropic etching is applied by using a resist mask (not shown) patterned through a transfer process to form through holes 137 in the interlayer insulating films 135 and 136. Then organic plugs 138 are formed to fill the lower half of the through holes 137.

In the next process shown in FIG. 34, first, a resist (not shown) is deposited and patterned through a transfer process to form a resist mask (not shown). Next, anisotropic etching is applied by using the resist mask to form interconnection trenches 139 and dummy interconnection trenches 140 in the interlayer insulating film 136. Like the dummy interconnection trenches 134 formed in the interlayer insulating film 112, the dummy interconnection trenches 140 are formed so that flatter copper interconnections can be obtained in the following CMP process.

In the next process shown in FIG. 35, first, a barrier metal 141 is deposited and then copper 142 is deposited to fill the through holes 137 and interconnection trenches 139 and 140 and also to cover the top surface of the interlayer insulating film 136. The step height 143 is formed low because of the dummy interconnection trenches 140.

In the next process shown in FIG. 36, first, CMP is applied to smooth the top surface of copper by using the interlayer insulating film 136 as a stopper. The presence of the dummy interconnection trenches 140 enables improved flatness. This process step forms copper plugs in the through holes 137, copper interconnections 144 in the interconnection trenches 139, and dummy copper interconnections 145 in the dummy interconnection trenches 140.

Next, for example, silicon nitride is deposited to form an interlayer insulating film 146 and SiOF is deposited to form an interconnection insulating film 147.

These series of process steps of forming interconnection trenches and through holes in an interlayer insulating film, forming a barrier metal, burying and depositing copper, and applying CMP to remove excess copper, is called "dual damascene method." The dummy patterns are formed not only to improve the flatness in the CMP process but also to correct the proximity effect in which the finished resist form is affected by the proximate pattern form in the transfer process.

As described above, the dummy interconnections 122 of FIG. 29 and the dummy interconnections 134b and 145 of FIG. 36 are formed to improve the flatness of the interconnections and interlayer insulating films, and they are not involved directly in the circuit function of the integrated circuitry formed in the semiconductor device. Accordingly, in conventional applications, the dummy interconnections are left in an electrically floating state without being connected to any circuit terminals in the semiconductor device.

The recent progress toward highly integrated LSIs has narrowed the interconnection pitch and increased the operating frequency to hundreds of megahertz to several gigahertz, and as a result some problems are being encountered due to the dummy interconnections left in an electrically floating state. First, in an interconnection, e.g. in a precharge interconnection, the potential varies from 0 V (ground potential) to $V_{DD}$ (higher power-supply potential) in a short time and then the passage of current creates a magnetic field loop around that interconnection. This magnetic field loop causes a displacement current in an adjacent dummy interconnection through electromagnetic induction. The displacement current flows until the dummy interconnection potential becomes uniform. Since the dummy interconnection is electrically floating, its potential is determined by the history of the circuit operation. If this displacement current is large, then a magnetic field loop is produced around the dummy interconnection, which induces a displacement current due to electromagnetic induction in another interconnection adjacent to the dummy interconnection. This current is superimposed on the signal as noise.

Second, as a certain interconnection and a dummy interconnection are spaced at a smaller interval, the coupling capacitance becomes larger between them. Accordingly, the amount of image charge occurring on the dummy interconnection increases in accordance with the amount of charge flowing in the interconnection. This image charge affects signal on another interconnection and causes noise.

These two phenomena can be considered to be cross-talk between interconnections through dummy interconnections. Noise of this kind exerts serious effects especially in analog circuitry, which has been a considerable problem.

Japanese Patent Application Laid-Open No.8-222632 (1996) (which is referred to as a first reference), Japanese Patent Application Laid-Open No.10-199882(1998) (a second reference), and Japanese Patent Application Laid-Open No.4-179126(1992) (a third reference) are known as reference materials which disclose techniques related to this invention.

SUMMARY OF THE INVENTION

According to a first aspect of the present invention, a semiconductor device comprises: a semiconductor substrate having a main surface along which a semiconductor element is formed; interlayer insulating films formed on the main surface; conductive interconnections provided in a plurality of layers separated by the interlayer insulating films; conductive dummy interconnections and provided in the same layers as the interconnections in two or more layers included in the plurality of layers; and a conductive dummy plug selectively buried in the interlayer insulating films to connect the dummy interconnections between the two or more layers and connected together with the dummy interconnections to a stable potential line which is included in the interconnections and which holds a constant potential with respect to a potential carried on a lower-potential power-supply line or a higher-potential power-supply line.

According to a second aspect of the invention, a semiconductor device comprises: a semiconductor substrate having a main surface in which an element isolation structure for isolating the main surface into a plurality of regions is selectively formed, each of the plurality of regions having a semiconductor element formed therein; interlayer insulating films formed on the main surface; conductive interconnections provided in a plurality of layers separated by the interlayer insulating films; conductive dummy interconnections provided in the same layers as the interconnections in two or more layers included in the plurality of layers; a conductive dummy plug selectively buried in the interlayer insulating films to connect the dummy interconnections between the two or more layers; a conductive layer formed in a part of the element isolation structure; and another conductive plug selectively buried in the interlayer insulating films to connect the conductive layer and the dummy interconnections.

According to a third aspect of the invention, in the semiconductor device, the dummy interconnections and the dummy plug are connected to a stable potential line which is included in the interconnections and which holds a constant potential with respect to a potential carried on a lower-potential power-supply line or a higher-potential power-supply line.

According to a fourth aspect of the invention, in the semiconductor device, the plurality of regions correspond to a plurality of functional blocks in an integrated circuit, and each of the plurality of functional blocks is surrounded by the conductive layer together with the element isolation structure.

According to a fifth aspect of the invention, in the semiconductor device, a trench is formed in part of the element isolation structure and the conductive layer is buried in the trench.

According to a sixth aspect of the invention, in the semiconductor device, the semiconductor substrate further comprises a buried insulating layer, the element isolation structure comprises a part connected to the buried insulating layer, and the conductive layer selectively extends through the part of the element isolation structure to reach the buried insulating layer.

According to a seventh aspect of the invention, in the semiconductor device, the dummy interconnections are provided to sandwich an interconnection part included in the interconnections in at least one of the two or more layers.

According to an eighth aspect of the invention, in the semiconductor device, the dummy interconnections also comprise a dummy interconnection which is provided in a layer located over the at least one layer to cover over the interconnection part.

According to a ninth aspect of the invention, in the semiconductor device, the stable potential line is any of the lower-potential power-supply line, the higher-potential power-supply line, a precharge line included in the interconnections and carrying a precharge potential, and a substrate potential line included in the interconnections and carrying a substrate potential.

According to a tenth aspect of the invention, in the semiconductor device, at least one of the dummy interconnections has repetitive protrusions and recesses along its elongate direction in a section taken along the main surface.

According to an eleventh aspect of the invention, in the semiconductor device, at least one of the dummy interconnections has repetitive protrusions and recesses along its elongate direction in a section taken along a plane perpendicular to the main surface.

According to a twelfth aspect of the invention, in the semiconductor device, the protrusions among the repetitive protrusions and recesses are connected to a part of the dummy interconnection provided in a lower layer.

According to a thirteenth aspect of the invention, the semiconductor device further comprises a passivation film covering the uppermost layer among the plurality of layers and having a higher thermal conductivity than the interlayer insulating films.

According to a fourteenth aspect of the invention, the semiconductor device further comprises a heat sink which is in contact with the passivation film.

According to a fifteenth aspect of the invention, in the semiconductor device, the dummy interconnections also comprise one which is provided in the uppermost layer, and the semiconductor device further comprises another conductive dummy plug selectively buried in the passivation film to connect the heat sink and part of the dummy interconnection which belongs to the uppermost layer.

According to the device of the first aspect, the dummy interconnections are formed in a plurality of layers and connected through the dummy plug, and these dummy conductors are fixed at a stable potential. Hence it is possible to effectively reduce the noise induced on the interconnections or cross-talk by means of the shielding effect of the dummy conductors. Further, it is also possible to reduce the soft error caused by cosmic rays by removing α-rays caused by the cosmic rays or secondarily produced electron-hole pairs to some extent.

According to the device of the second aspect, the dummy interconnections are formed in a plurality of layers and connected through the dummy plug, and these dummy conductors are connected to the conductive layer formed in part of the element isolation structure through another dummy plug. Hence it is possible to effectively cool the element isolation structure to effectively suppress temperature rise in the semiconductor substrate.

According to the device of the third aspect, the conductive layer formed in part of the element isolation structure is connected to a stable potential line through the dummy conductors, which effectively reduces interference between the semiconductor elements separated by the element isolation structure.

According to the device of the fourth aspect, each of the plurality of functional blocks is surrounded by the conductive layer together with the element isolation structure, which effectively suppresses interference between the functional blocks.

According to the device of the fifth aspect, the effect of cooling the element isolation structure can be further enhanced since the conductive layer is buried in the element isolation structure.

According to the device of the sixth aspect, the conductive layer passes through the element isolation structure to reach the buried insulating layer, which enhances the effect of cooling the buried insulating layer, thus more effectively suppressing the temperature rise in the semiconductor substrate.

According to the device of the seventh aspect, the dummy interconnections are formed to sandwich an interconnection part in the same layer, which further enhances the effect of reducing the noise or cross-talk.

According to the device of the eighth aspect, the dummy interconnection is provided to cover the interconnection part, which further enhances the effect of reducing the noise or cross-talk.

According to the device of the ninth aspect, the stable potential line connected to the dummy conductors is a lower-potential power-supply line, a higher-potential power-supply line, a precharge line, or a substrate potential line, which realizes fixing at a highly stable potential. Furthermore, the stable potential can be selected in accordance with the potential carried on an interconnection to be shielded so as to further enhance the shielding effect.

According to the device of the tenth aspect, the dummy interconnection has repetitive protrusions and recesses along the elongate direction in a section taken along the main surface of the semiconductor substrate, which increases the surface area of the dummy interconnection. This increases the capacitance of the dummy interconnection and further enhances the shielding effect.

According to the device of the eleventh aspect, the dummy interconnection has repetitive protrusions and recesses along the elongate direction in a section taken along a plane vertical to the main surface of the semiconductor substrate, which enhances the effect of removing the heat accumulated in the interlayer insulating films.

According to the device of the twelfth aspect, the protrusions in the repeatedly protruded and recessed part are connected to part of the dummy interconnection provided in the lower layer, which further enhances the effect of dissipating heat accumulated in the interlayer insulating films.

According to the device of the thirteenth aspect, the passivation film covering the uppermost layer and having a larger thermal conductivity than the interlayer insulating films allows the heat accumulated in the interlayer insulating films to be effectively dissipated.

According to the device of the fourteenth aspect, the presence of the heat sink in contact with the passivation film allows the heat accumulated in the interlayer insulating films to be dissipated more effectively.

According to the device of the fifteenth aspect, the heat sink and the dummy interconnection in the uppermost layer are connected through another dummy plug, which further effectively dissipate the heat accumulated in the interlayer insulating films.

Thus, an object of the present invention is to provide a semiconductor device which can reduce noise superimposed upon signals carried on interconnections or cross-talk.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 3 to 6 are process diagrams showing the manufacture of the device of the first preferred embodiment.

FIG. 13 is an explanation diagram showing, in a table form, examples of the structure of the device of the second preferred embodiment.

FIGS. 20 and 21 are sectional views showing other examples of the structure of the device according to the third preferred embodiment.

DESCRIPTION OF THE PREFERRED EMBODIMENTS

1. First Preferred Embodiment.

According to a semiconductor device of a first preferred embodiment of the invention, dummy interconnections are formed in a plurality of layers and connected through dummy plugs and these dummy conductors (generic name of the dummy interconnections and dummy plugs) are connected to an interconnection which carries a ground potential, whereby the potential of the dummy conductors is fixed at the ground potential in the operation of the semiconductor device. Since the potential of the dummy conductors is fixed at the ground potential, the displacement current and image charge caused by a voltage variation in conductors (generic name of interconnections and plugs) adjacent to the dummy conductors do not remain on the dummy interconnections for a long time. This provides the effect of remarkably reducing the noise which the displacement current or image charge occurring in the dummy interconnections or dummy plugs induce on adjacent other interconnections or plugs.

1.1. Manufacturing process and structure of the device.

A preferred process for manufacturing the semiconductor device of the first preferred embodiment will now be described. The meaning of "dummy interconnection" and the structure of the completed semiconductor device will become clear through the description of the manufacturing process. Although the description below shows an example in which a silicon substrate is used as the semiconductor substrate, the invention is not limited to this example. This applies also to other preferred embodiments.

Figure 1:
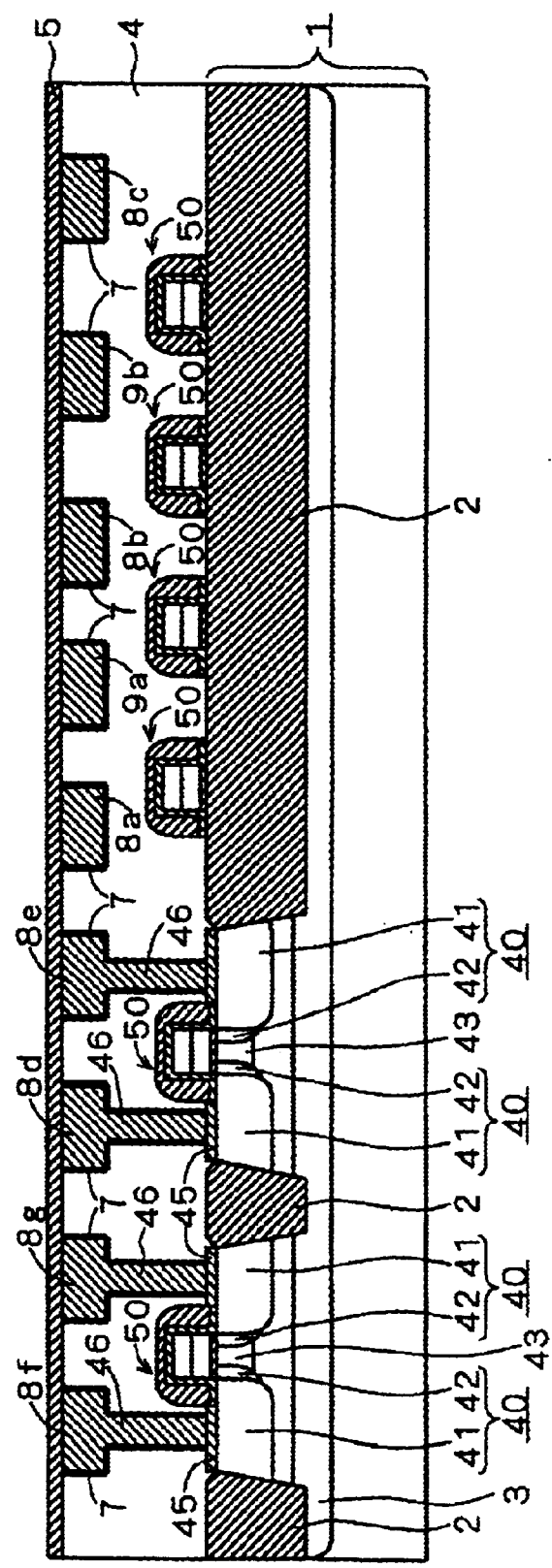
FIG. 1 is a process diagram showing the manufacture of a device according to a first preferred embodiment.

FIGS. 1 to 7 are process diagrams showing the manufacture of a semiconductor device of the first preferred embodiment. The process shown in FIG. 1 is performed first. In the process shown in FIG. 1, first, a channel-cut layer (a channel stopper layer) 3 is formed in a semiconductor substrate 1 which is a silicon substrate. Next, STIs 2 as element isolation structure and MOSFETs as semiconductor elements are formed in and on the main surface of the semiconductor substrate 1. The STIs 2 are selectively formed in the main surface of the semiconductor substrate 1 to electrically isolated adjacent MOSFETs.

Since the process of manufacturing MOSFETs is conventionally known, the MOSFETs will be briefly described only about their completed structure. That is to say, each MOSEET has a pair of $N^+$ source/drain regions (a set of a source region and a drain region is referred to as "source/drain regions" together) 41, a pair of $N^-$ source/drain regions 42 and a channel region 43, which are regions selectively formed in the surface of the semiconductor substrate 1. A pair of the N+ source/drain regions 41 and a pair of the N− source/drain regions 42 form a pair of source/drain regions 40. A pair of silicide layers 45 are formed on a pair of N+ source/drain regions 41.

Figure 2:
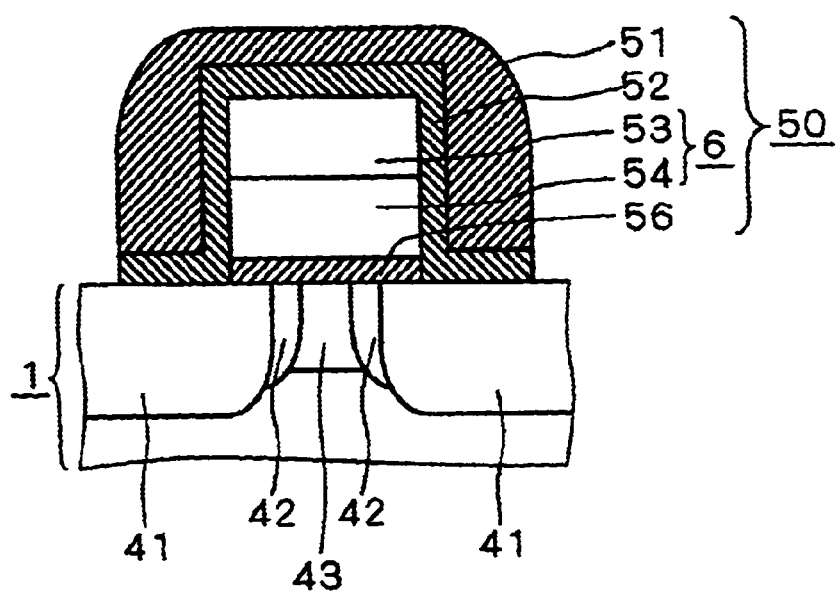
FIG. 2 is an enlarged view showing part of FIG. 1.

Gate electrodes 6, each having a double-layer structure of a doped polysilicon layer 54 and a tungsten silicide layer 53 as shown in FIG. 2 in an enlarged manner, are selectively formed on the main surface of the semiconductor substrate 1; each gate electrode 6 faces to the channel region 43 through a gate insulating film 56. Further, each gate electrode 6 is covered by a sidewall 51 with a silicon oxynitride film 52 interposed therebetween. The structure 50 composed of the sidewall 51 and the inside thereof is called a gate structure herein. As shown in FIG. 1, gate structures 50 may be provided also on the STI 2 as gate interconnections.

After the formation of the MOSFETs and STIs 2, an interlayer insulating film 4 is deposited over the main surface of the semiconductor substrate 1 so thick as to cover the sidewalls 51. Preferably, for the material of the interlayer insulating film 4, an insulator having a relative dielectric constant of 3.5 or less, such as SiOF, is used to reduce the capacitance between interconnections.

Subsequently, copper plugs 46 as source/drain electrodes of the MOSFETs, copper interconnections 8 (8a to 8g), and dummy copper interconnections 9 (9a and 9b) are formed by using the damascene method. A barrier metal 7 is interposed between these conductors and the interlayer insulating film 4. A film of metal nitride, such as WN, TiN, TaN, etc., is used as the material of the barrier metal 7. Next, a silicon nitride film is deposited as an interlayer insulating film 5 to prevent oxidation of the exposed copper interconnections 8 and 9. The procedure of the damnascene method used here is the same as that described referring to FIGS. 30 to 33 and so it is not fully described again.

Figure 3:
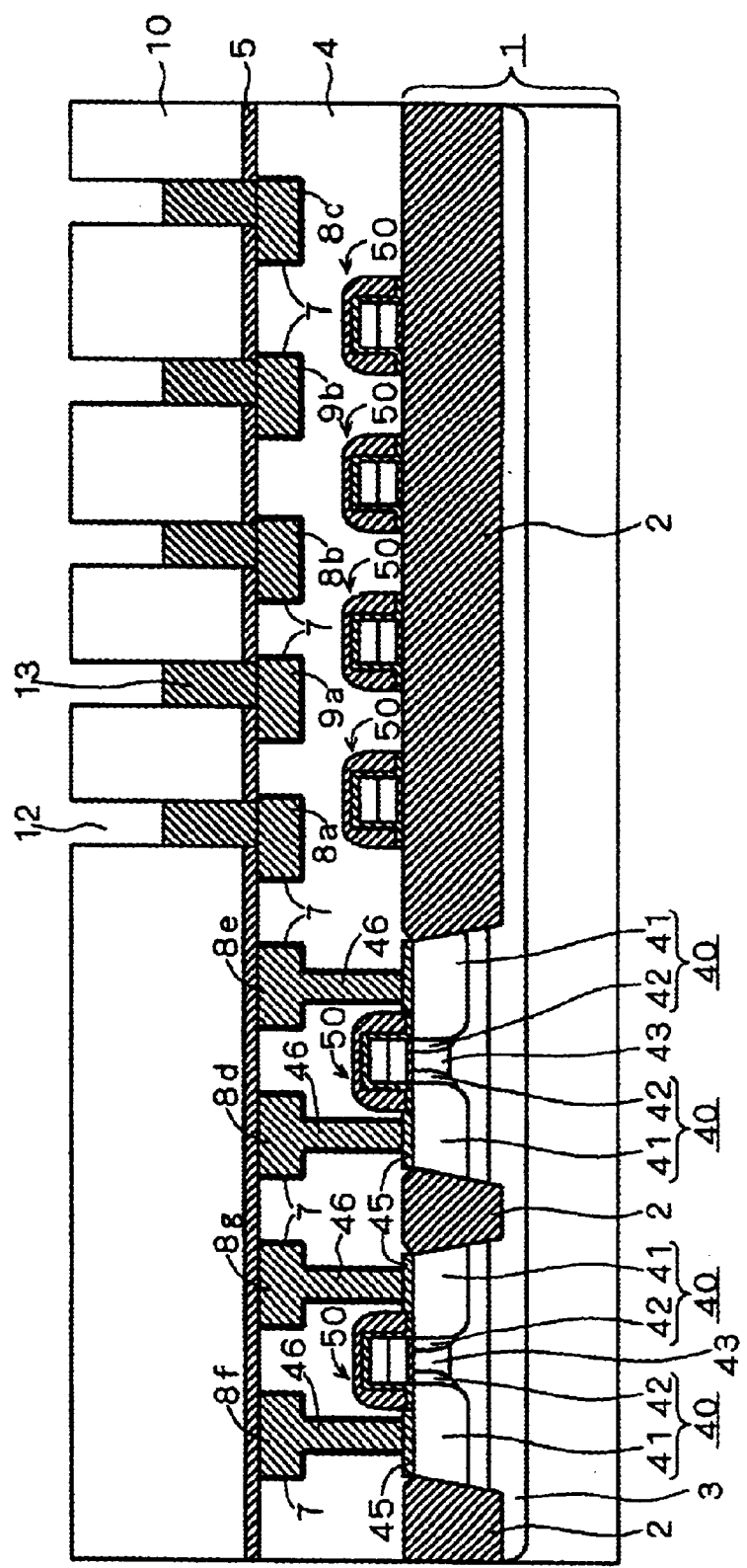

In the next process shown in FIG. 3, first, an interlayer insulating film 10 is deposited. Then a resist mask is formed through a conventionally known transfer process and an anisotropic etching is applied by using this resist mask to selectively form through holes 12 in the interlayer insulating film 10. This process is characterized in that the through holes 12 are formed not only above the copper interconnections 8a to 8c but also above the dummy copper interconnections 9a and 9b. Organic plugs 13 made of resist, for example, are then put in the lower parts of the through holes 12.

Figure 4:
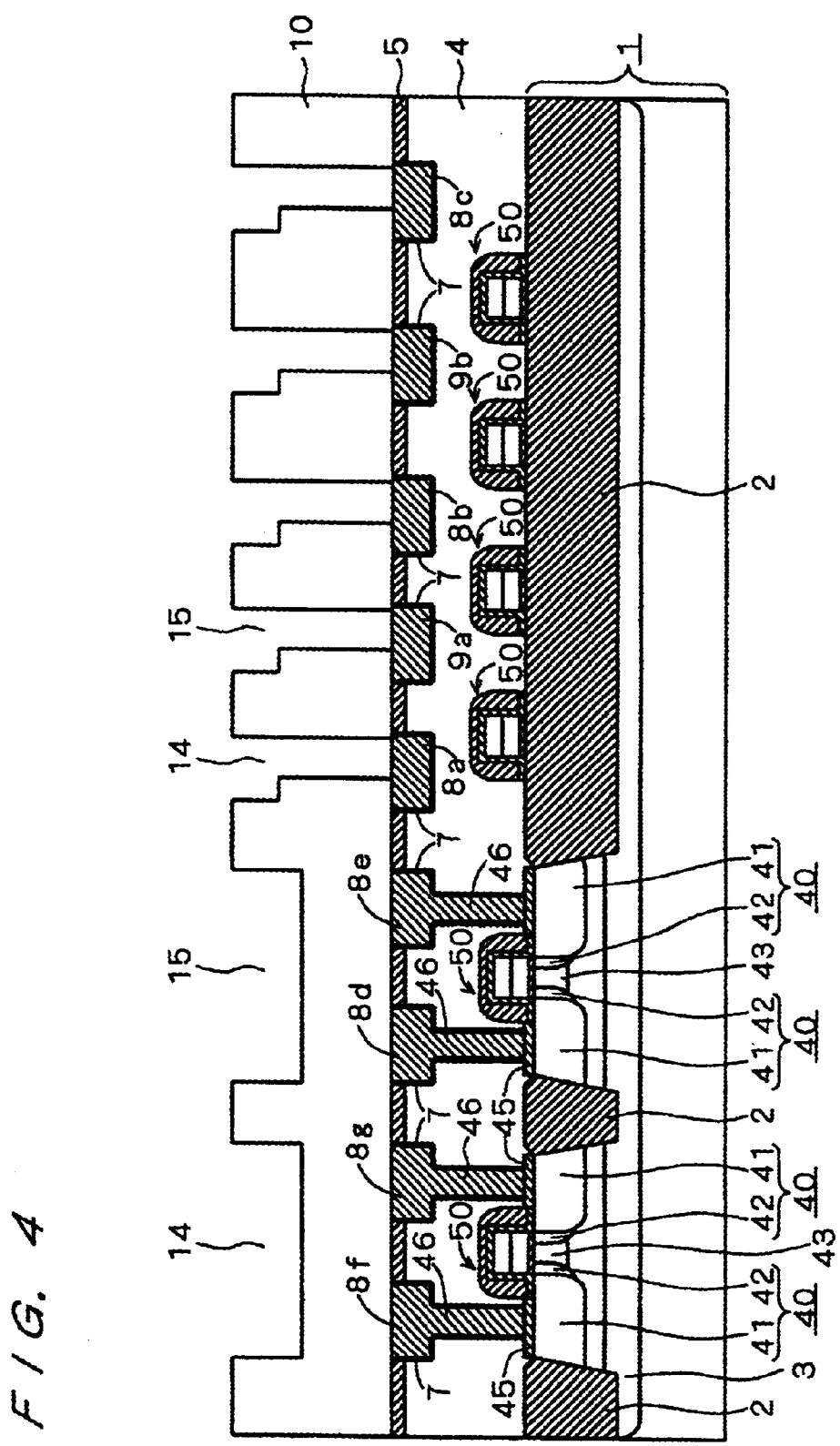

In the next process shown in FIG. 4, first, a resist mask is formed through a transfer process and anisotropic etching is applied to the interlayer insulating film 10 by using this resist mask to form interconnection trenches 14 and dummy interconnection trenches 15 in the upper parts of the through holes 12. As shown in the left half in FIG. 4, an interconnection trench 14 and a dummy interconnection trench 15 may be formed also in the top surface of the interlayer insulating film 10 where no through hole 12 is formed.

The resist plugs 13 (FIG. 3) serve to prevent etching damage to the copper interconnections or interlayer insulating film located on the bottoms and sides of the through holes 12 in the anisotropic etching. The dummy interconnection trenches 15 are formed for the purpose of obtaining improved flatness after CMP without being deteriorated by nonuniform interconnection density.

Figure 5:
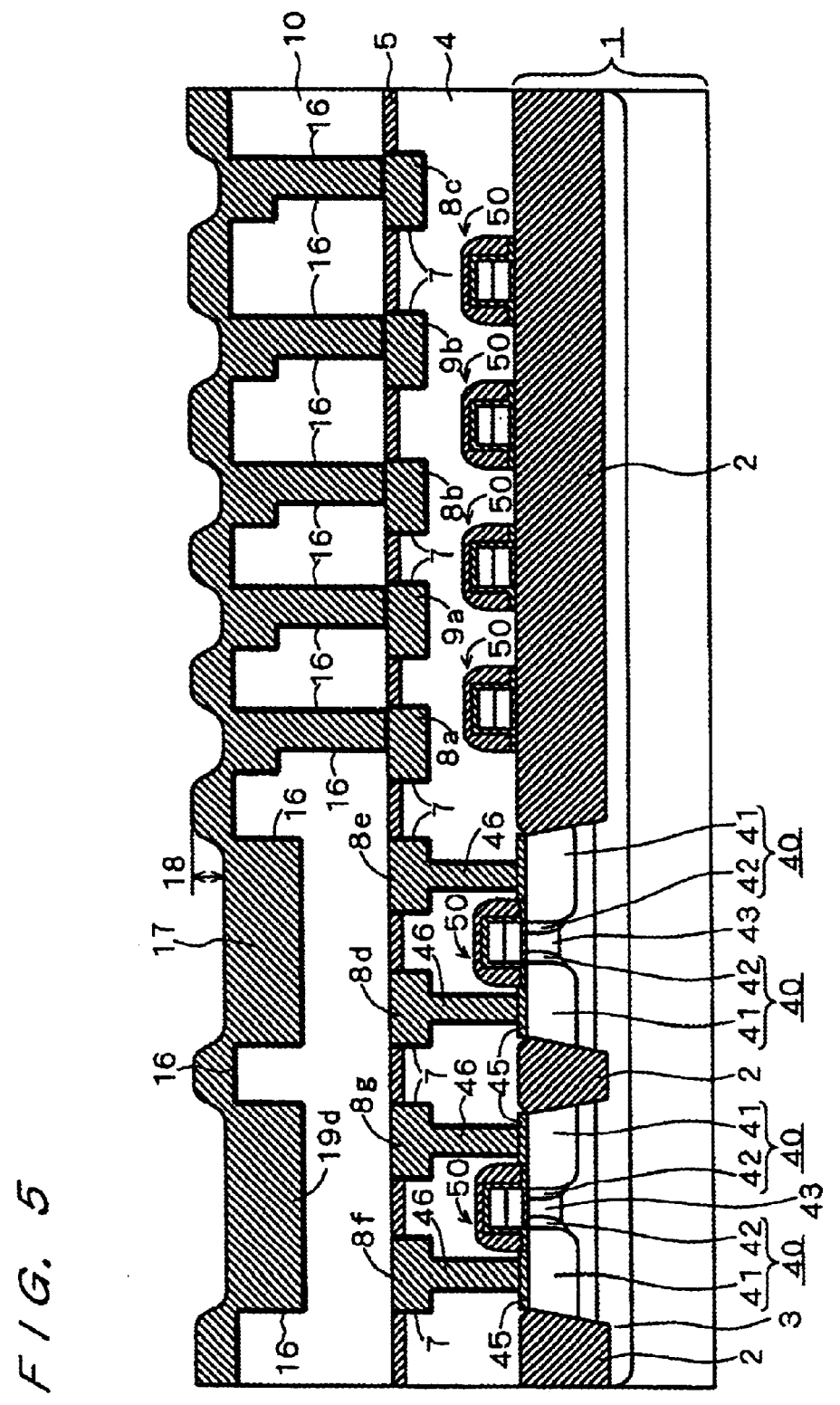

In the next process shown in FIG. 5, first a barrier metal 16 is formed on the bottoms and sides of the interconnection trenches 14, dummy interconnection trenches 15 and through holes 12 and on the top surface of the interlayer insulating film 10. For the material of the barrier metal 16, a film of metal nitride such as titanium nitride (TiN), tungsten nitride (WN), tantalum nitride (TaN), etc. is used, for example. The barrier metal 16 is formed to prevent atoms of copper used as the interconnection material from diffusing into the interlayer insulating film 10.

Next, copper 17 is deposited by CVD, PVD, or with electroplating apparatus to fill the through holes 12, interconnection trenches 14, and dummy interconnection trenches 15 and to cover the top surface of the interlayer insulating film 10. As stated before, when CVD or PVD is used to deposit copper 17, small step heights 18 form approximately uniformly on the surface of the copper 17 because of the presence of the dummy interconnection trenches 15. When the electroplating method is used to deposit the copper 17, the step heights 18 due to nonuniform interconnection density is further reduced.

Figure 6:
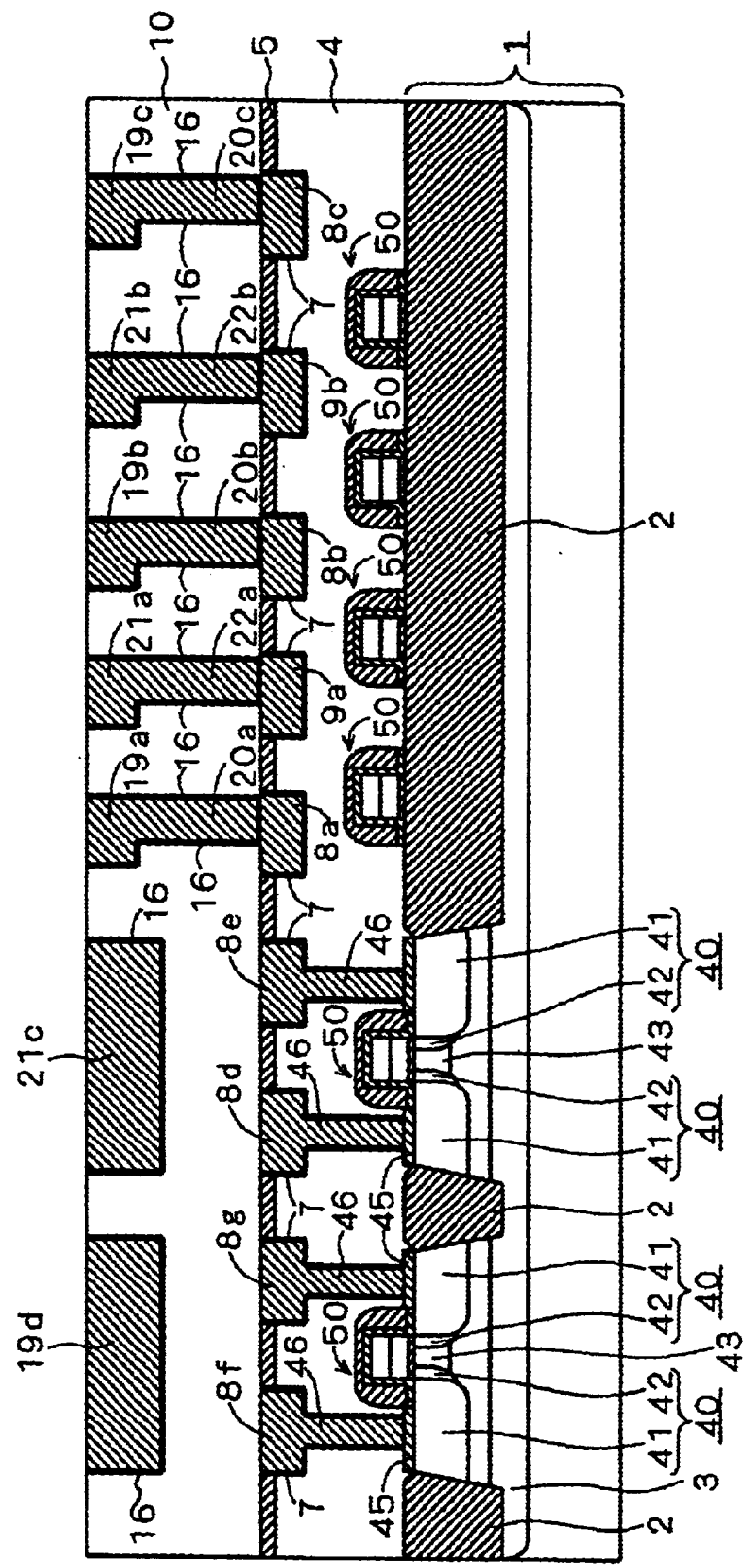

In the next process shown in FIG. 6, excess copper is chemically-mechanically removed by using a CMP device to smooth the surface so that the top surface of the interlayer insulating film 10 and the top surface of the copper 17 approximately coincide with each other. In this process, the barrier metal 16 covering the top surface of the interlayer insulating film 10 is also removed and the interlayer insulating film 10 serves as a stopper. This process forms the copper 17 into copper plugs 20a to 20c and dummy copper plugs 22a and 22b in the through holes 12, the copper interconnections 19a to 19d in the interconnection trenches 14, and the dummy copper interconnections 21a to 21c in the dummy interconnection trenches 15.

The presence of the dummy copper interconnections 21a to 21c reduces the variation in polishing rate caused by the nonuniform density among the copper interconnections 19a to 19d, which improves the flatness obtained after the CMP process. Through these process steps, the interconnection trenches 14 and 15 and the through holes 12 were formed in the interlayer insulating film 10, followed by the formation of the barrier metal 16, filling and deposition of copper, and a CMP process for removing excess copper, whereby the dual damascene method has been achieved.

Figure 7:
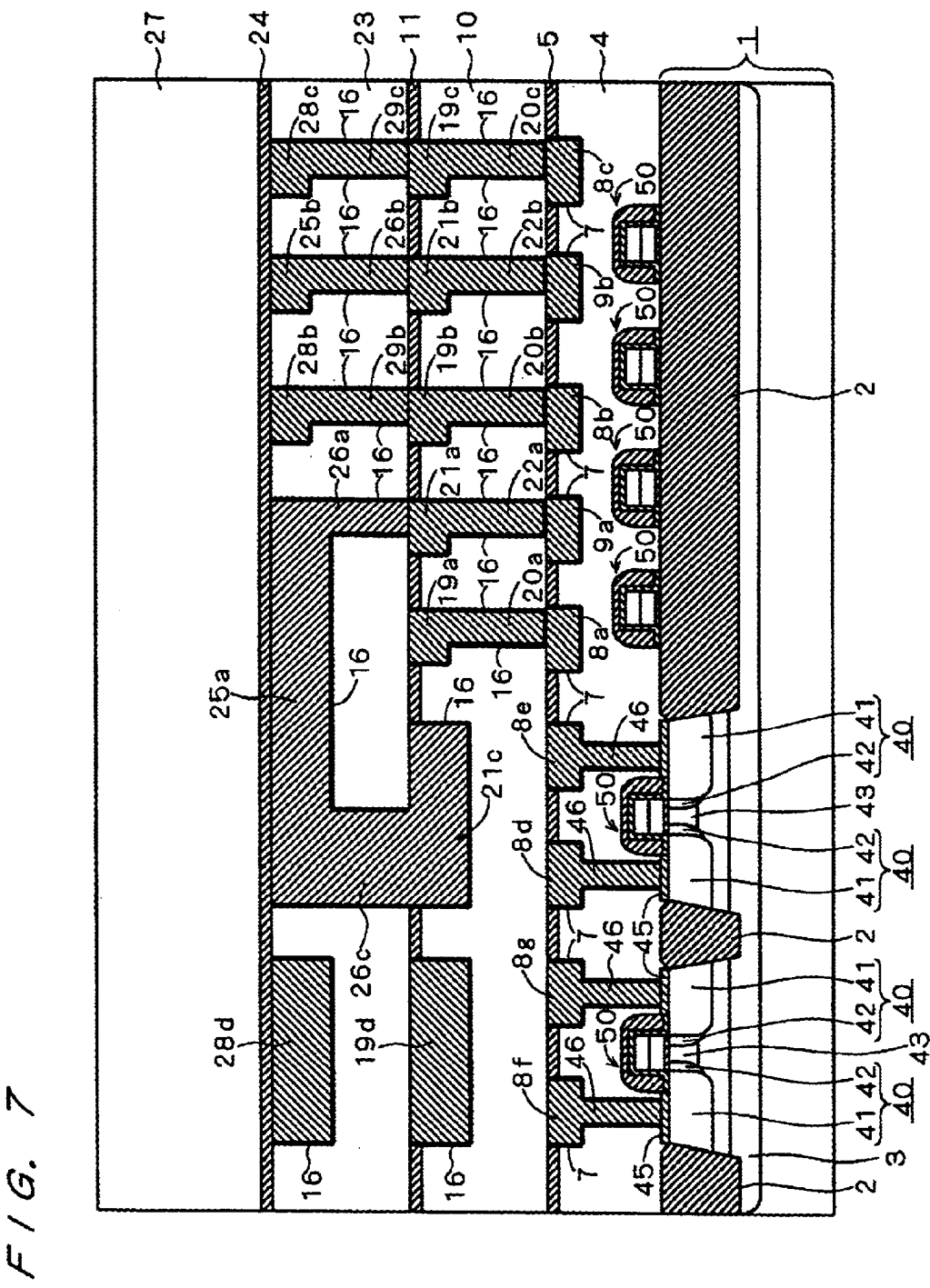
FIG. 7 is a sectional view showing the structure of the device of the first preferred embodiment.

The semiconductor device is completed in the next process shown in FIG. 7. That is to say, while FIG. 7 is a manufacture process diagram, it is also a sectional view showing the structure of the completed semiconductor device.

In the process step of FIG. 7, the dual damascene method is performed again, thus forming upper-layer interconnections 25 (25a, 25b), 28 (28a to 28d) and plugs 26 (26a to 26c), 29 (29a to 29c) in the upper-layer interlayer insulating film 23. The uppermost interconnections are covered by an interlayer insulating film 24 and a passivation film 27. This process is characterized in the following points. First, the grounded (i.e. connected to interconnection carrying the ground potential of the semiconductor device) dummy interconnections 9a and 9b, the grounded dummy interconnections 21b to 21c, and the grounded dummy interconnections 25a and 25b are provided respectively between the interconnections 8a, 8b and 8c, between the interconnections 19a to 19d, and between the interconnections 28b to 28d carrying signals which contribute to the operation of the MOSFETs or to the circuit functions of the semiconductor device.

Secondly, the grounded dummy plugs 22a and 22b and the grounded dummy plug 26b are provided respectively between the plugs 20a to 20c and plugs 29b and 29c which carry signals. Forming not only the interconnections but also the grounded dummy plugs between plugs reduces the noise applied to the signals transferred through the plugs. In other words, the grounded dummy plugs or dummy interconnections serve to shield the signal interconnections from the surroundings, which prevents cross-talk between the signal interconnections or noise invasion of the signal interconnections, The dummy interconnections 9, 21 and 25 are connected to a ground interconnection in area which is not shown in FIG. 7. The connection between the dummy interconnections and ground interconnection will be fully described later in the second preferred embodiment.

Since the dummy interconnection 21a and the dummy interconnection 21c are electrically connected through the upper-layer dummy interconnection 25a and dummy plugs 26a and 26c, the potential can be fixed at 0 V (ground potential) by connecting them to a common ground interconnection. Even when a dummy interconnection is surrounded by signal interconnections in the same layer in a plane parallel to the main surface of the semiconductor substrate 1 and the potential cannot be fixed at an ground interconnection in the same plane due to the interconnection arrangement, connecting a plurality of dummy interconnections through plugs in a three-dimensional space as shown in FIG. 7 allows them to be connected to a common ground interconnection.

In the structure shown in FIG. 7, the interconnection 19a is surrounded by the dummy interconnections 21a, 21c and 25a and the dummy plugs 26c, 26a and 22a, which provides a remarkable shielding effect. Then an improved S/N (signal to noise) ratio can be obtained when the interconnection 19a is assigned as an interconnection carrying very small signal, e.g. a bit line connecting memory cells and sense amplifiers. Further, the interconnection 28b and the plug 29b are shielded from the surroundings by the dummy interconnections 25a and 25b and the dummy plugs 26a and 26b, which provides an improved S/N ratio as well.

1.2. Comparison with prior arts.

The first reference mentioned before discloses a device example in which an interconnection which contributes directly to the circuit operation of the semiconductor device is connected to a dummy plug. However, this reference does not disclose the feature of the first preferred embodiment of this invention that a dummy interconnection and a dummy plug are connected. It is said in the paragraph [0018] in the first reference that "since such a dummy pattern (as a dummy plug, from the context in the preceding paragraphs) is made of a metal, it is preferably set electrically neutral." From the standpoint of those having ordinary skill in the art, "set electrically neutral" is interpreted as fixing the potential at the ground potential. However, the dummy plug is not connected to a dummy interconnection, but it is connected to a ground interconnection which contributes directly to the circuit operation. Thus, the first reference does not disclose the connection between a dummy plug and a dummy interconnection.

According to the semiconductor device of the first preferred embodiment, dummy plugs can be connected to a ground interconnection through dummy interconnections even if the dummy plugs are separated far apart from the ground interconnection in the interconnection and plug layout in the process of manufacturing the semiconductor device. While the second preferred embodiment described later shows examples in which the potential of the dummy conductors is fixed at a higher-potential power-supply interconnection and others in place of the ground interconnection, the potential can be fixed through dummy interconnections even when the dummy plugs are located far apart from the higher-potential power-supply interconnection. The first reference does not disclose even the technique of connecting a dummy plug to a higher-potential power-supply interconnection.

The second reference discloses a semiconductor device having a multi-layer interconnection structure in which a plurality of interconnection layers are stacked, where dummy interconnection layers provided in a plurality of layers are connected through dummy plugs provided in interlayer insulating films. However, the second reference does not disclose the technique of fixing these dummy conductors at a stable potential like the ground potential.

Further, the third reference discloses a semiconductor device in which a metal shield layer is formed to cover almost the entire main surface of a semiconductor substrate and the shield layer is fixed at the ground potential. However, this shield layer only has a plane structure, not an interconnection structure pattern structure). The third reference does not disclose other interconnections located in the same layer as the shield layer. This can be clearly seen from the first to fifth lines in Problems to be Solved by the Invention in the third reference, which says: while each metal layer in the conventional multi-layer metal interconnection structure is an interconnection layer, the interconnection layers can provide neither a shield against noise invasion from the surroundings nor a shield against penetration of noise occurring in the upper-layer interconnection layers into the substrate.

The dummy interconnections are provided for the purpose of reducing the step height while they do not directly contribute to the circuit operation. Considering the purpose, they must be provided in the same layer as other interconnections (interconnections which contribute directly to the circuit operation). Hence, it is concluded that the third reference lacks disclosure of the dummy interconnections.

As has been already stated, the semiconductor device of the first preferred embodiment is characterized in that the dummy interconnections are formed in a plurality of layers and are connected through dummy plugs and that these dummy conductors are fixed at the ground potential. The dummy plugs can be defined as plugs connected to the dummy interconnections. None of the first to third references disclose this feature. As stated above, this feature provides the effect of effectively reducing the noise superimposed upon the signals carried on the interconnections or cross-talk, which cannot be expected from any of the first to third references. The following effect is also obtained in addition.

When cosmic rays such as neutron rays drift in a semiconductor substrate, nuclear reaction occurs between the atomic nucleuses forming the semiconductor substrate and the cosmic rays and then an $\alpha$ray is emitted. The $\alpha$-ray generates electron-hole pairs while traveling. The charge of the electron-hole pairs causes malfunction of the semiconductor device. This phenomenon is known as soft error.

The soft error can be suppressed if the generated $\alpha$ray can be trapped before invading the semiconductor substrate 1 or if the electron-hole pairs generated in the interlayer insulating films, interconnections, or plugs can be removed. Since the dummy interconnections formed in a plurality of layers are connected through the dummy plugs and their potential is fixed, it is possible to remove the $\alpha$ray or electron-hole pairs to a certain extent. This effect cannot be expected from any of the first to third references, either.

1.3. Preferred form of the dummy interconnections.

Figure 8:
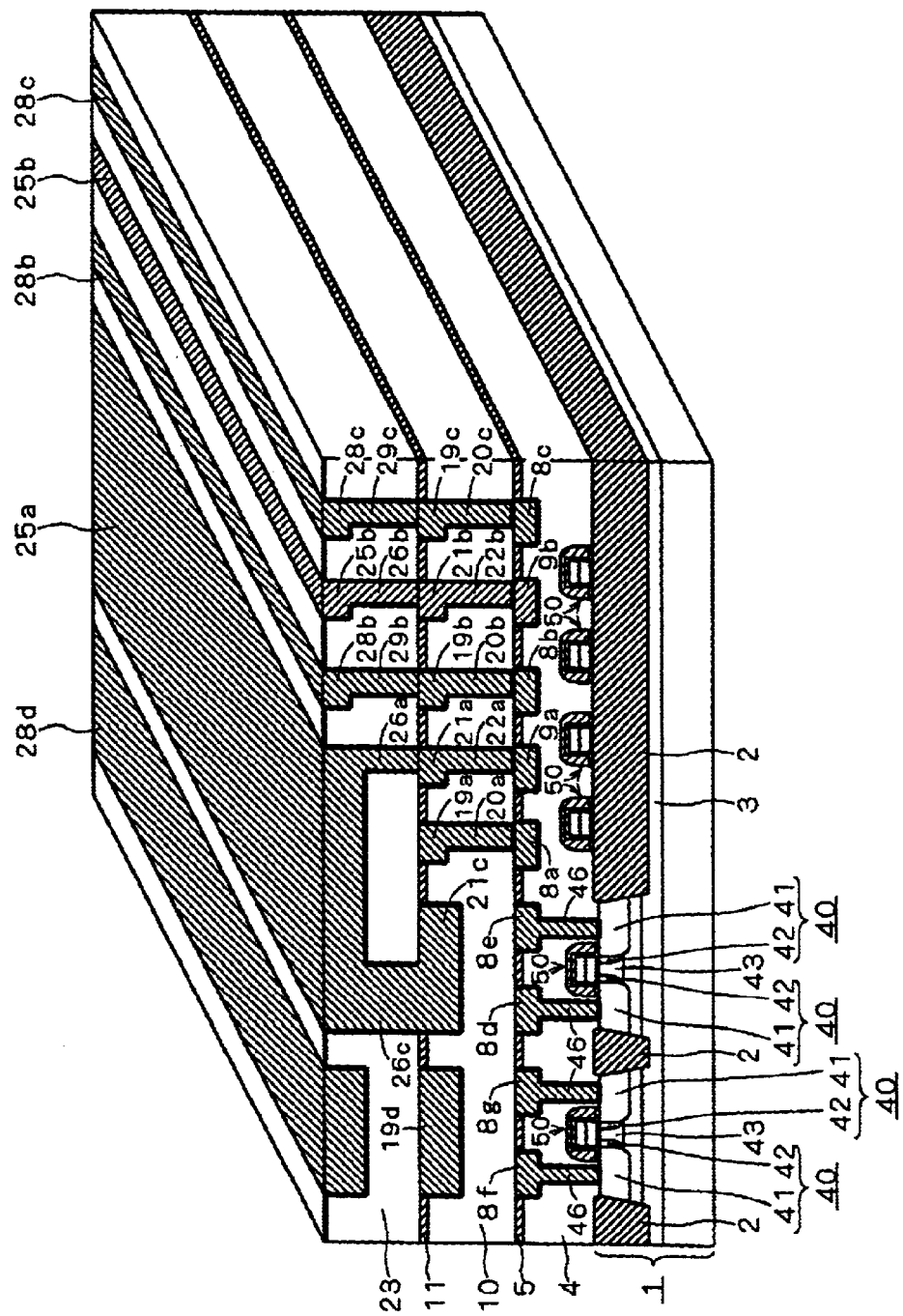
FIG. 8 is a sectional perspective view showing an example of the structure of the device of the first preferred embodiment.

FIG. 8 is a cross-sectional perspective view showing an example of the plane configuration of the interconnections 25 and 28 in the semiconductor device shown in FIG. 7. As shown in FIG. 8, the dummy interconnections 25a and 25b and the interconnections 28b, 28c and 28d run in parallel with each other and they are formed in a belt-like form in the plane configuration. The interconnections 25 and 28 have a simple plane configuration in the example shown in FIG. 8, which provides the advantage of facilitating the layout design.

Figure 9:
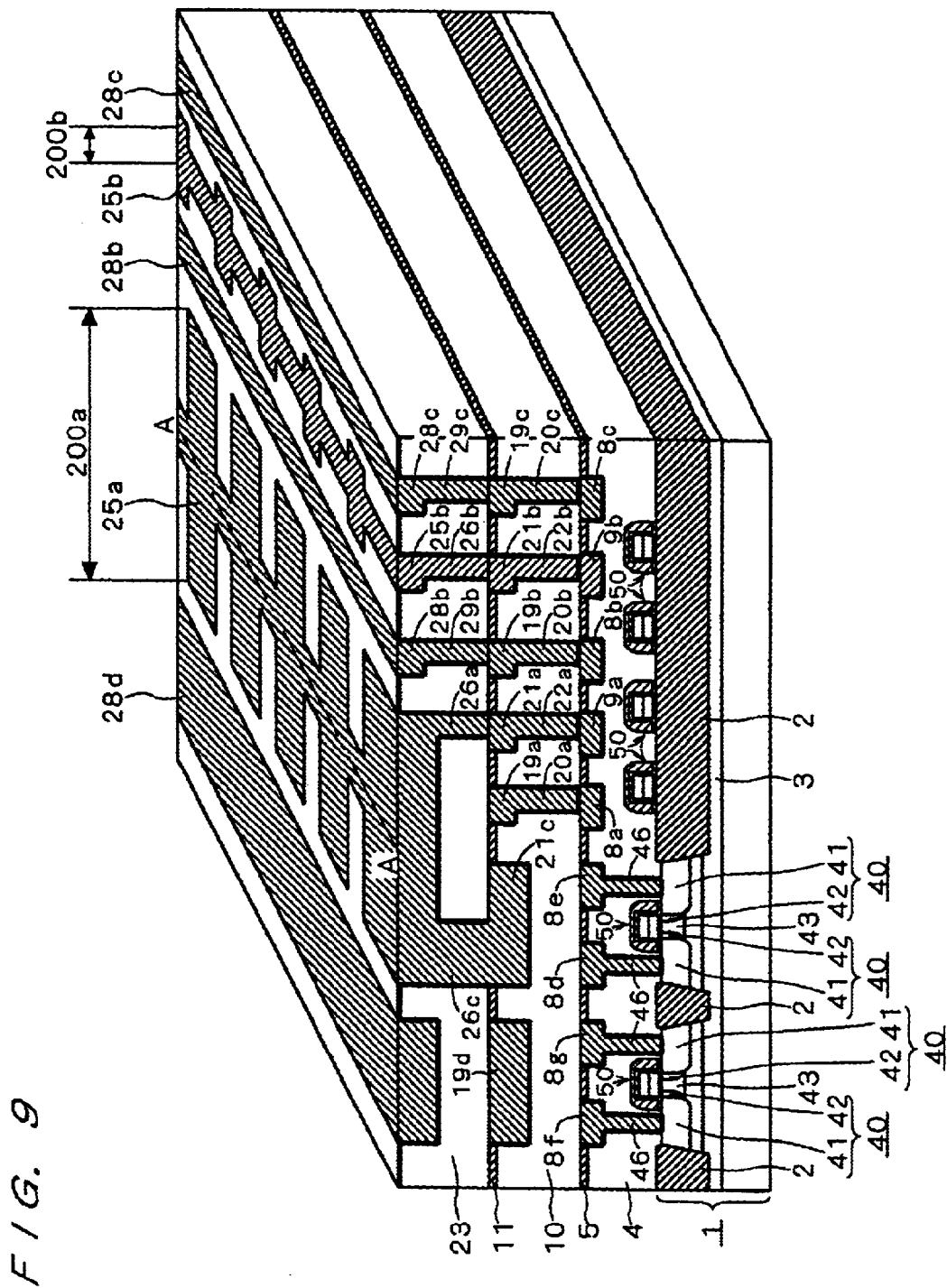
FIG. 9 is a sectional perspective view showing another example of the structure of the device of the first preferred embodiment.

On the other hand, while the example shown in FIG. 9 is the same as that shown in FIG. 8 in that the dummy interconnections 25a and 25b and the interconnections 28b, 28c and 28d run in parallel with each other, this example characteristically differs from that of FIG. 8 in that the plane configuration of the dummy interconnections 25a and 25b has a fin structure in which protrusions and recesses are repeatedly formed along the elongate direction. The fin structure increases the surface area of the dummy interconnections 25a and 25b to increase the capacitance of the dummy interconnections 25a and 25b, which provides the advantage of enhancing the shielding effect.

In FIG. 9, the dummy interconnection 25a and the dummy interconnection 25b have different fin structures. In the fin structure of the dummy interconnection 25a, areas narrower than the original interconnection width (the interconnection width adapted for the purpose of dummy interconnections to reduce the step height) 200a are repeatedly formed. On the other hand, in the fin structure of the dummy interconnection 25b, areas wider than the original interconnection width 200b are repeatedly formed. The two structures can be chosen on the basis of the relation between the space between the interconnections 28 and dummy interconnections 25 and the minimum interconnection width in the transfer process or etching process. For example, when the original interconnection width 200b corresponds to the minimum interconnection width in the transfer process or etching process, the fin structure having areas wider than the original interconnection width, as that of the dummy interconnection 25b, will be adopted.

2. Second Preferred Embodiment.

A second preferred embodiment of the invention shows a semiconductor device in which dummy interconnections are formed in a plurality of layers and are connected through dummy plugs and these dummy conductors (generic name of the dummy interconnections and dummy plugs) are connected to an interconnection carrying a constant potential (i.e. a stable potential) with respect to a lower power-supply potential or a higher power-supply potential, not limited to a ground interconnection carring the ground potential, whereby the potential of the dummy conductors is fixed at a stable potential during operation of the semiconductor device. Particularly, this preferred embodiment describes examples in which the potential of the dummy conductors is fixed at a stable potential which is the closest to the potential carried on an adjacent conductor, among the lower power-supply potential (including the ground potential) $V_{SS}$, higher power-supply potential $V_{DD}$, precharge potential $V_{PC}$ and substrate potential $V_{BB}$, and examples in which the potential of the dummy conductors is fixed at a stable potential different from it.

Generally, fixing the dummy interconnections at a stable potential enhances the effect of suppressing the noise superimposed on the interconnection or cross-talk through the shielding effect of the dummy interconnections. This will be fully described first.

2.1. Simple model of capacitance between interconnections.

Figure 10:
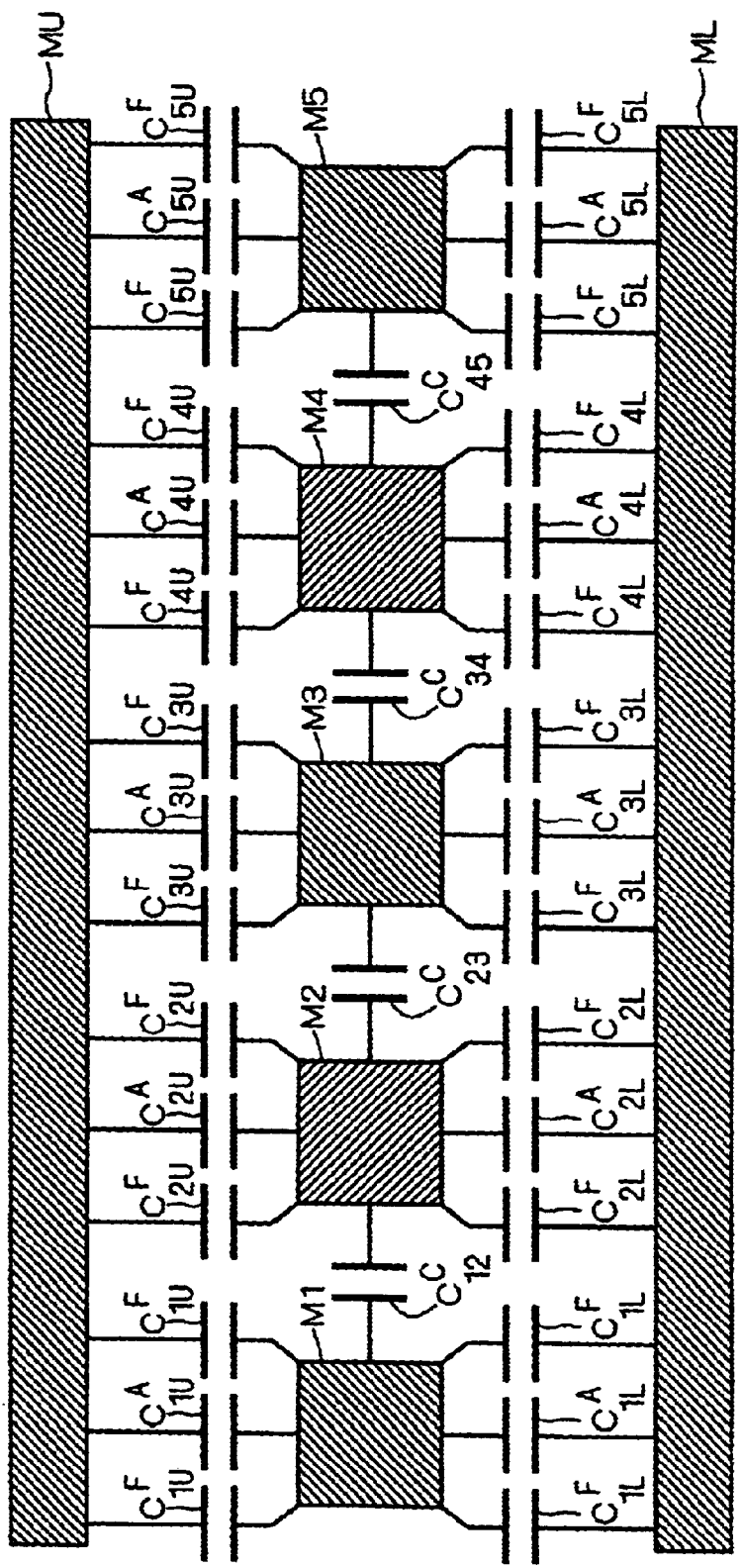
FIGS. 10 and 11 are schematic diagrams used to explain the operation principle of a device of a second preferred embodiment.

FIG. 10 is a schematic diagram illustrating the parasitic capacitances generated in a line and space pattern. Interconnections M1 to M5 are formed in the same layer between the lower-layer interconnection ML and upper-layer interconnection MU. The interconnections M1 to M5 include dummy interconnections M2 and M4; the interconnections M1, M3 and M5 are interconnections which contribute directly to the circuit operation. The interconnections are insulated by an interlayer insulating film (not shown). In the diagram, "C" represents the capacitances between interconnections, the subscript represents Nos. of interconnections which contribute to the capacitances, the superscript "A" represents the area component of the capacitances, "F" represents the fringe component of the capacitances, and "C" represents the coupling component.

Narrowing the pitch in an LSI generally narrows the intervals between interconnections. When the coupling capacitance between interconnections in the same layer is approximated with a parallel-plate capacitance C, then the coupling capacitance is given as follows.

$$C^C = \varepsilon \frac{S}{d} \qquad \text{Eq. 1}$$

Where $\in$ denotes the dielectric constant of the interlayer insulating film, d denotes the interval between parallel plates and S denotes the area of the parallel plates. When the interconnection intervals between the interconnections M1 to M3 in the same layer are narrowed while ensuring the thickness of the interlayer insulating film interposed between the upper-layer interconnection and the lower-layer interconnection, then the coupling capacitance increases, for the interconnection interval corresponds to the interval d in the equation 1. Particularly, as the pitch becomes smaller with the miniaturization of the LSIs, the coupling component becomes dominant among the parasitic capacitance components. In the parasitic capacitance of the interconnection M3, the coupling capacitance component is given by the equation 2 below.

$$C_3{}^C = C_{23}{}^C + C_{34}{}^C \qquad \text{Eq.2}$$

The image charge on the interconnection M3 which is caused by the coupling capacitance is given by the equation 3 below.

$$Q_3{}^C = C_{23}{}^C \cdot \Delta V_{23} + C_{34}{}^C \cdot \Delta V_{34} \qquad \text{Eq.3}$$

This image charge causes delay of the signal carried on the interconnection M3. Considering these conditions, we discuss an appropriate potential to be applied to the dummy interconnections supposing the following two cases.

2.1.1. When the potential of the interconnection M3 is $V_{SS}$ or $V_{DD}$.

When the potential on the interconnection M3 is the lower power-supply potential (including the ground potential =0 V) $V_{SS}$ or the higher power-supply potential $V_{DD}$, the potential on the interconnection M3 must be kept constant and stable. When the interconnections M1 and M5 are signal lines and the dummy interconnections M2 and M4 are absent, the coupling components $C^C{}_{13}$ and $C^C{}_{35}$ occur for the interconnection M3 and noise is induced on the interconnection M3 due to the signals carried on the interconnections M1 and M5, and then the potential on the interconnection M3 may become unstable.

The dummy interconnections M2 and M4 are provided to solve this problem: when the interconnection M3 is a higher-potential power-supply line carrying the higher power-supply potential $V_{DD}$, the interconnections M2 and M4 are fixed at the higher power-supply potential $V_{DD}$, and when the interconnection M3 is a lower-potential power-supply line carrying the lower power-supply potential $V_{SS}$, then the interconnections M2 and M4 are fixed at the lower power-supply potential $V_{SS}$. From the equation 3, no potential difference then exists between the interconnection M3 and interconnection M2 and between the interconnection M3 and the interconnection M4 and so the parasitic charge on the interconnection M3 is reduced. Accordingly, even if the interconnection M3 is a long interconnection, and even if a potential variation occurs on the interconnection M3, the power-supply voltage stabilizing circuit operates to allow the potential on the interconnection M3 to recover the higher power-supply potential $V_{DD}$ in a shorter time. Further, fixing the potential of the interconnections M2 and M4 shields the interconnection M3 from the interconnections M1 and M5. Therefore the interconnection M3 is not affected by the signals carried on the interconnections M1 and M5 and the potential on the interconnection M3 is kept stable.

For example, when the interconnection 28d in the structure shown in FIG. 7 is a higher-potential power-supply line, fixing the dummy interconnection 25a at the higher power-supply potential $V_{DD}$ reduces the parasitic charge between the interconnection 28d and the dummy interconnection 25a. Accordingly, even if the metal interconnection 28d is very long and a voltage drop has occurred in a part separated far apart from the power supply, due to its large resistance and small parasitic capacitance, the voltage drop can be corrected in a shorter time to recover the original higher power-supply potential $V_{DD}$. At the same time, since the interconnection 28b and the interconnection 28d, which are signal lines, are shielded from each other by the dummy interconnection 25a, noise can be reduced on both of the interconnection 28b and the interconnection 28d.

2.1.2. When the interconnection M3 is a precharge line.

When the interconnection M3 is a precharge line, a precharge potential $V_{PC}$ (usually half of $V_{DD}(=V_{DD}/2)$ or $V_{DD}$) is applied to the interconnection M3 as one state in a series of circuit operations. For example, when the semiconductor device is a DRAM or SRAM, pairs of bit lines, which are a kind of precharge lines, are precharged before the operation of reading information from the memory cells or the operation of writing information into the memory cells. After the bit lines are precharged, a path transistor turns on and a small voltage is superimposed on the bit lines. A sense amplifier performs a potential comparison between the bit lines in a pair: when the potential on one bit line is higher than the potential on the other bit line, the potential on that bit line varies to the higher power-supply potential $V_{DD}$. On the other hand, if it is lower than the potential on the other bit line, it varies to the lower power-supply potential $V_{SS}$. The bit information in each memory cell can be read and written by comparing the potentials on the bit lines in a pair.

Thus, when the interconnection M3 is a precharge line, the potential varies from the precharge potential $V_{DD}/2$ to 0 V or to $V_{DD}$ and also in the opposite way. This variation is repeated frequently. This potential variation induces noise on the interconnections near the precharge line. Accordingly it is preferred that the precharge line is shut off from the surrounding area. At the same time, shutting off the precharge line also reduces noise induced on the precharge line due to nearby signal lines.

The image charge given by the equation 3, which is induced on the interconnection M3 because of the coupling capacitances, becomes smaller as the potential difference between the interconnection M2 and the interconnection M3 and the potential difference between the interconnection M3 and the interconnection M4 become smaller. When the precharge voltage $V_{DD}/2$ is applied to the interconnections M2 and M4, then the time average value of the charge $Q^C_3$ comes close to the minimum value. Accordingly, when the interconnection M3 is a precharge line which is precharged to the potential $V_{DD}/2$, it is the most suitable to fix the dummy interconnections M2 and M4 at the precharge potential $V_{PC}=V_{DD}/2$.

In the structure shown in FIG. 8, if the interconnection 19b is a precharge line, for example, then fixing the dummy interconnections 21a and 21b and the dummy plugs 22a and 22b at the precharge potential $V_{PC}$ reduces the time average of the parasitic charge on the interconnection 19b, which allows signal transmission with a high S/N ratio. At the same time, this also suppresses the phenomenon that a noise due to a potential variation on the precharge line is induced on the adjacent interconnections 19a and 19c.

Not only the interconnections in DRAM or SRAM but also interconnections connected to an output of a logic circuit like an inverter may be precharged to speed up the circuit operation. In this case, the precharge line is first set at the higher power-supply potential $V_{DD}$ and then it varies to the lower power-supply potential $V_{SS}$ as the circuit operates. Since the potential variation is as large as $V_{DD}$, a large noise is induced on interconnections near the precharge line.

Accordingly, for example, when the interconnection M3 in FIG. 10 is such a precharge line, it is possible to prevent the noise caused by the interconnection M3 from affecting other signal interconnections like the interconnections M1 and M5 by fixing the dummy interconnections M2 and M4 at the lower power-supply potential $V_{SS}$ to shield the interconnection M3.

Alternatively, when the precharge line in a logic circuit like an inverter is less frequently varied to the lower power-supply potential $V_{SS}$ during the circuit operation, the precharge voltage may be applied to the dummy interconnections M2 and M4 of FIG. 10 to prevent induction of parasitic charge on the interconnection M3, as shown by the equation 3, which provides the effect of further speeding up the circuit operation.

As stated above, different potentials can be applied to the dummy interconnections depending on the circuit position in the same semiconductor device. Hence a plurality of dummy interconnections and dummy plugs may be fixed at different potentials depending on the position in the same semiconductor device.

2.2. Electromagnetic induction on interconnections which causes noise.

Figure 11:
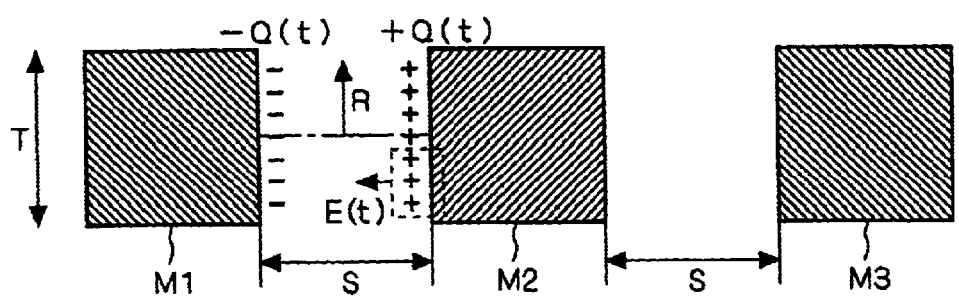

The preceding section has described the noise caused by a potential variation on a precharge line. This section describes the electromagnetic induction on interconnections which serves as the cause of this type of noise. FIG. 11 is a schematic diagram used to describe the electromagnetic induction on interconnections. Suppose that the charge uniformly distributed on the surface of the interconnection M1 is varying with time in the form of $-Q(t)=-Q(t)\cdot\sin \omega t$. The current $-dQ/dt=-Q\omega\cdot\cos \omega t$ flows.

Now we calculate the magnetic field produced between the interconnection M1 and the interconnection M2 in this case. Image charge $+Q(t)$ occurs on the interconnection M2. The Gauss' law $div D(x,t)=\rho(x,t)$ is applied to the interconnection M2. Where D(x,t) is the electric flux density and ρ(x,t) is the charge density. In the rectangular area shown by the broken line on the interconnection M2, the charge exists only on the surface of the interconnection M2, with no charge existing inside the interconnection M2. When the length of the interconnection M2 is taken as L and the field strength in the normal direction of the rectangular area is taken as E(t), then the equation 4 holds as shown below through the Gauss' law.

$$\varepsilon * E(t) = \frac{Q(t)}{L \cdot S} \qquad \text{Eq. 4}$$

Where $\varepsilon$ is the dielectric constant of the interlayer insulating film filling the interval between the metal interconnections. According to the Ampère-Maxwell law, the equation 5 below holds.

$$rotH(x, t) = i(x, t) + \frac{\partial D(x, t)}{\partial t} \qquad \text{Eq. 5}$$

Suppose a circular plate with a radius R around the center axis set in the interlayer insulating film between the interconnections M1 and M2. Since no current is flowing, i(x,t)=0. Through surface integral on the circular plate P of radius R, the left side is given as below.

$$\int_P rotH(x,t) \cdot ndS = \int H \cdot dx = 2\pi R \cdot H(R) \qquad \text{Eq. 6}$$

The right side is given as below.

$$\int_P \frac{\partial D}{\partial t} \cdot ndS = \pi R^2 \frac{\pi R^2}{S \cdot L} * \frac{dQ(t)}{dt} = \frac{\pi R^2}{S \cdot L} \cdot \omega Q \cos \omega t \qquad \text{Eq. 7}$$

Thus the equation 8 below is obtained.

$$H(R) = \frac{\omega Q}{2S \cdot L} \cdot R \cos \omega t = \frac{RI_1}{2S \cdot L} \qquad \text{Eq. 8}$$

Where $I_1$ is the current flowing in M1.

The magnetic field H due to the current $I_1$ flowing in the interconnection M1, as shown by the equation 8, is produced for the adjacent interconnection. When this magnetic field varies, then the electromotive force occurs on the interconnection M2 and a displacement current flows. This displacement current is not a current accompanying a signal but it serves as a noise. Hence, this kind of cross-talk can be prevented by providing a dummy interconnection fixed at 0V or the precharge potential $V_{PC}$ between the interconnection M1 carrying current as signal and the interconnection M2.

As stated above, setting zero potential difference between an interconnection and an adjacent dummy interconnection suppresses occurrence of parasitic charge, which shortens the time required to recover the original potential. This more effectively reduces the noise induced on the interconnections.

On the other hand, it is also possible to effectively reduce the noise induced on the interconnections by applying a potential difference between an interconnection and an adjacent dummy interconnection. This is derived from the following fact: a potential difference produces much parasitic charge and therefore, once the potential varies, recovering the original potential takes a longer time; but the parasitic charge produces electric line of force between the interconnection and dummy interconnection and it suppresses potential variation. As will be described in the next section, the two strategies can be chosen in accordance with the type of signals carried on the interconnections.

2.3. Example of fixing of potential of dummy conductors.

Figure 12:
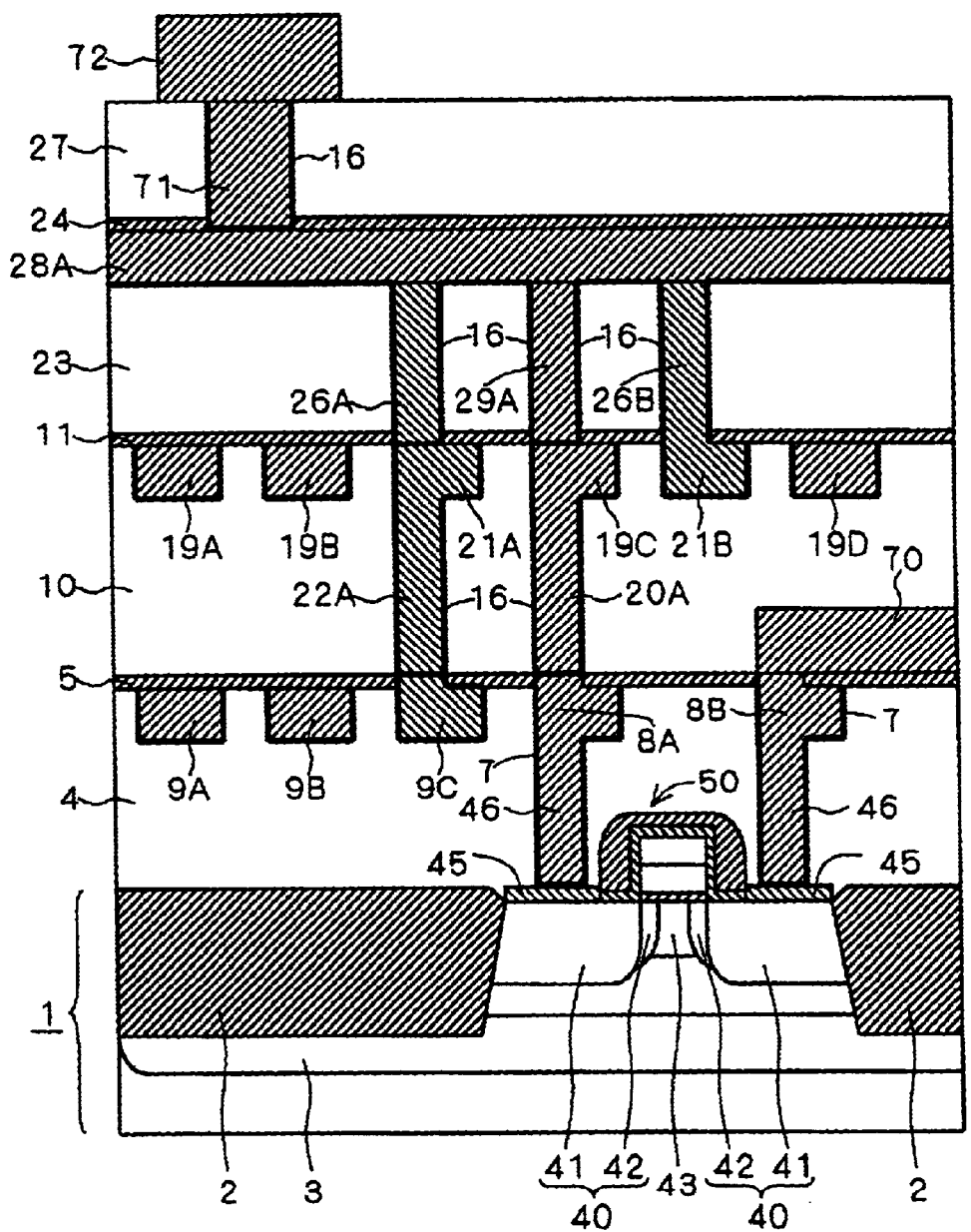
FIG. 12 is a sectional view showing an example of structure of the device of the second preferred embodiment.

Shown next are examples in which the dummy conductors are fixed at various potentials on the basis of the mechanism described above. FIG. 12 is a sectional view showing an example of a semiconductor device in which the dummy conductors are fixed at the ground potential. The semiconductor device of FIG. 12 therefore corresponds to the first preferred embodiment. FIG. 12 also shows a connection between dummy conductors and a ground interconnection which was not shown in FIG. 7 of the first preferred embodiment.

In the semiconductor device of FIG. 12, the interconnections 8A and 8B are connected to a pair of plugs 46 as the source/drain electrodes of the MOSFET and the interconnection 8A is further connected to the interconnection 28A through the plug 20A, interconnection 19C and plug 29A. The interconnection 8B is connected to the interconnection 70. The interconnection 28A is connected to the interconnection 72 in the uppermost layer through the plug 71. The interconnection 72 is provided as a lower-potential power-supply interconnection.

The first-layer interconnections include dummy interconnections 9A to 9C in addition to the interconnections 8A and 8B. The second-layer interconnections include the interconnections 19A to 19D including the interconnection 19C and the dummy interconnections 21A and 21B. The dummy interconnections 9C and 21A are connected to the dummy plugs 22A and 26A and the dummy interconnection 21B is connected to the dummy plug 26B. The dummy plugs 26A and 26B are connected to the interconnection 28A together with the plug 29A. Thus the dummy conductors 9C, 22A, 21A, 26A, 26B and 21B are fixed at the lower power-supply potential $V_{SS}$ together with the conductors 46, 20A, 19C and 29A.

While FIG. 12 shows an example in which the conductors and adjacent dummy conductors are both fixed at the lower power-supply potential $V_{SS}$, the potentials of these conductors are capable of various combinations as shown in FIG. 13.

The combinations Nos.1, 4, 8 and 12 are intended for the effect that the dummy interconnections 21A and 21B shut off the noise caused by the interconnection 19C and for the purpose of reducing the noise caused by the parasitic charge occurring on the interconnection 19C by applying zero potential difference between the dummy interconnections 21A and 21B and the interconnection 19C.

The combinations Nos.2, 3, 5, 6, 7, 9, 11 and 12 are indented for the effect that the dummy interconnections 21A and 21B shut off the noise caused by the interconnection 19C and for the purpose of reducing the noise by applying a potential difference between the dummy interconnections 21A and 21B and the interconnection 19C to stabilize the potential on the interconnection 19C.

When the interconnection 19C is a signal line which carries a signal $V_{SIG}$, the combinations Nos.13, 14, 15 and 16 are all effective to shut off the noise from the interconnection 19C used as a signal line. While FIG. 12 shows an example in which the interconnections as signal lines and the dummy interconnections are alternately arranged, one dummy interconnection may be provided between groups of signal lines.

The strategy in which the potential difference between an interconnection and an adjacent dummy interconnection is set to zero to reduce the noise induced on the interconnection is the most suitable in the combination No.4, and the strategy in which a potential difference is applied between an interconnection and an adjacent dummy interconnection is the most suitable in the combinations Nos.2 and 3.

An example corresponding to the combinations Nos.1, 8 and 12 of FIG. 13 can be represented as shown in FIG. 12. In FIG. 12, when the interconnection 72 is a lower-potential power-supply line, FIG. 12 shows an example of the combination No.8, and when it is a substrate potential line, it shows an example of the combination No.12.

Figure 14:
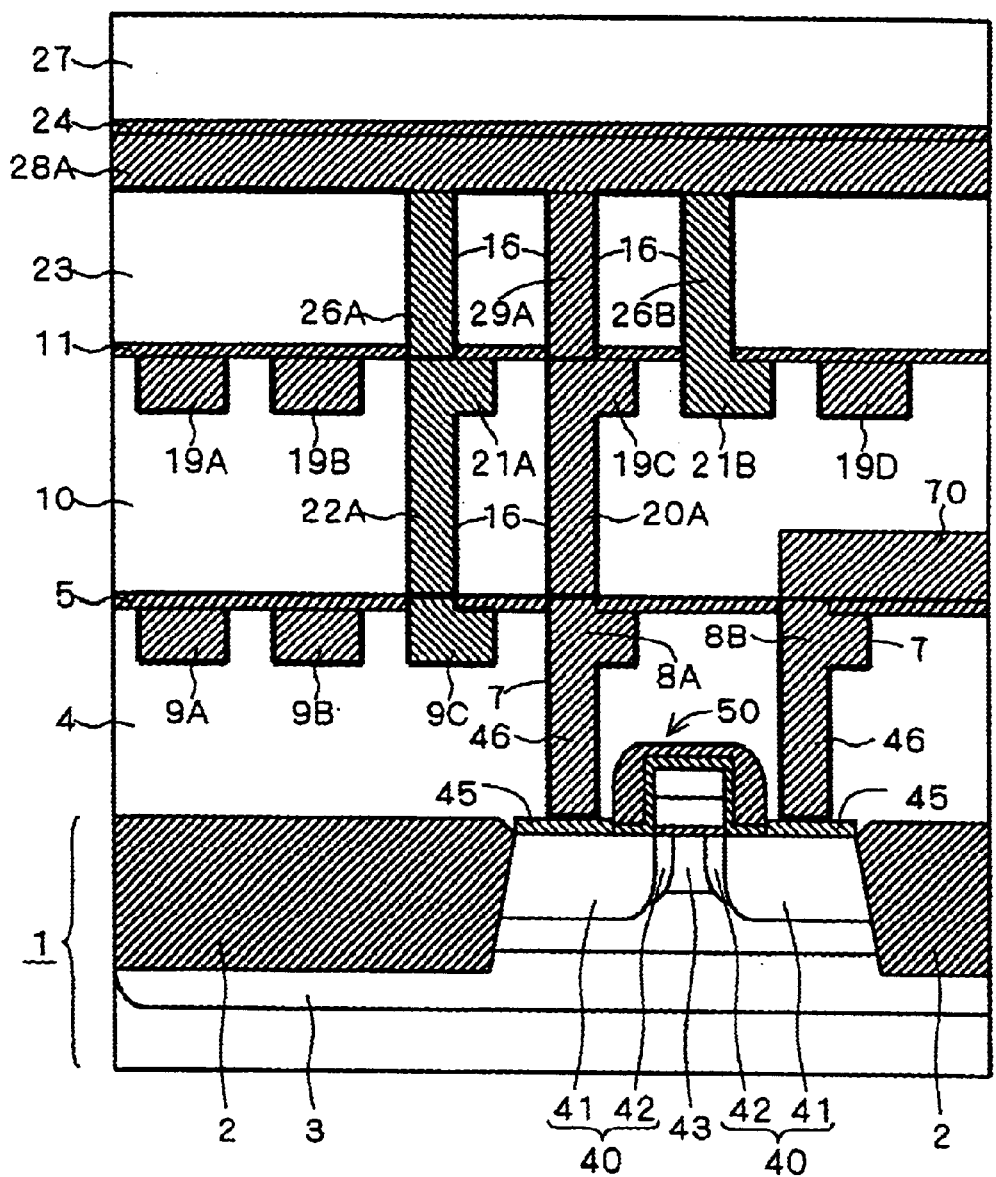
FIGS. 14 to 17 are sectional views showing other examples of the structure of the device of the second preferred embodiment.

An example of the combination No.4 is shown in FIG. 14. In FIG. 14, the interconnection 28A is a precharge line. In this example, the precharge line is shared between the dummy interconnection 21A and the interconnection 19C, and the voltage on them is set by the same precharge circuit. Since the precharge circuit is shared, this example provides the advantage of reducing the area penalty above the semiconductor substrate 1. The voltages of the dummy interconnection 21A and the interconnection 19C may be set by separate precharge circuits. In this case the respective precharge circuits must be synchronized with each other.

Figure 15:
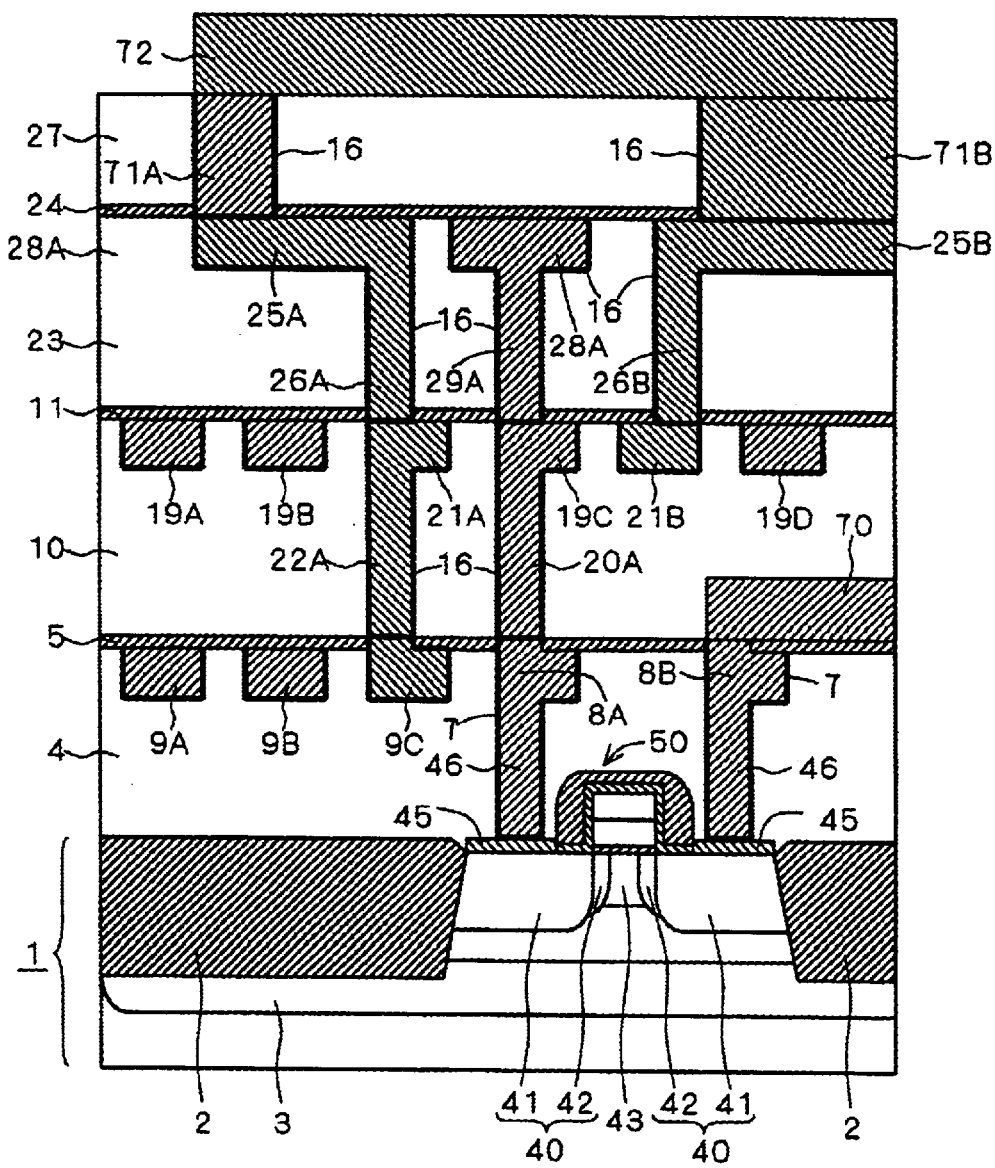

An example of the combinations Nos.2 and 3 is shown in FIG. 15. In FIG. 15, the dummy interconnection 25A and the dummy interconnection 25B are connected through the dummy plugs 71A and 71B and the dummy interconnection 72 in the uppermost layer. The interconnection 28A is a higher-potential power-supply line and the dummy interconnection 72 is connected to a lower power-supply potential line or a substrate potential line in a part not shown in the diagram.

Figure 16:
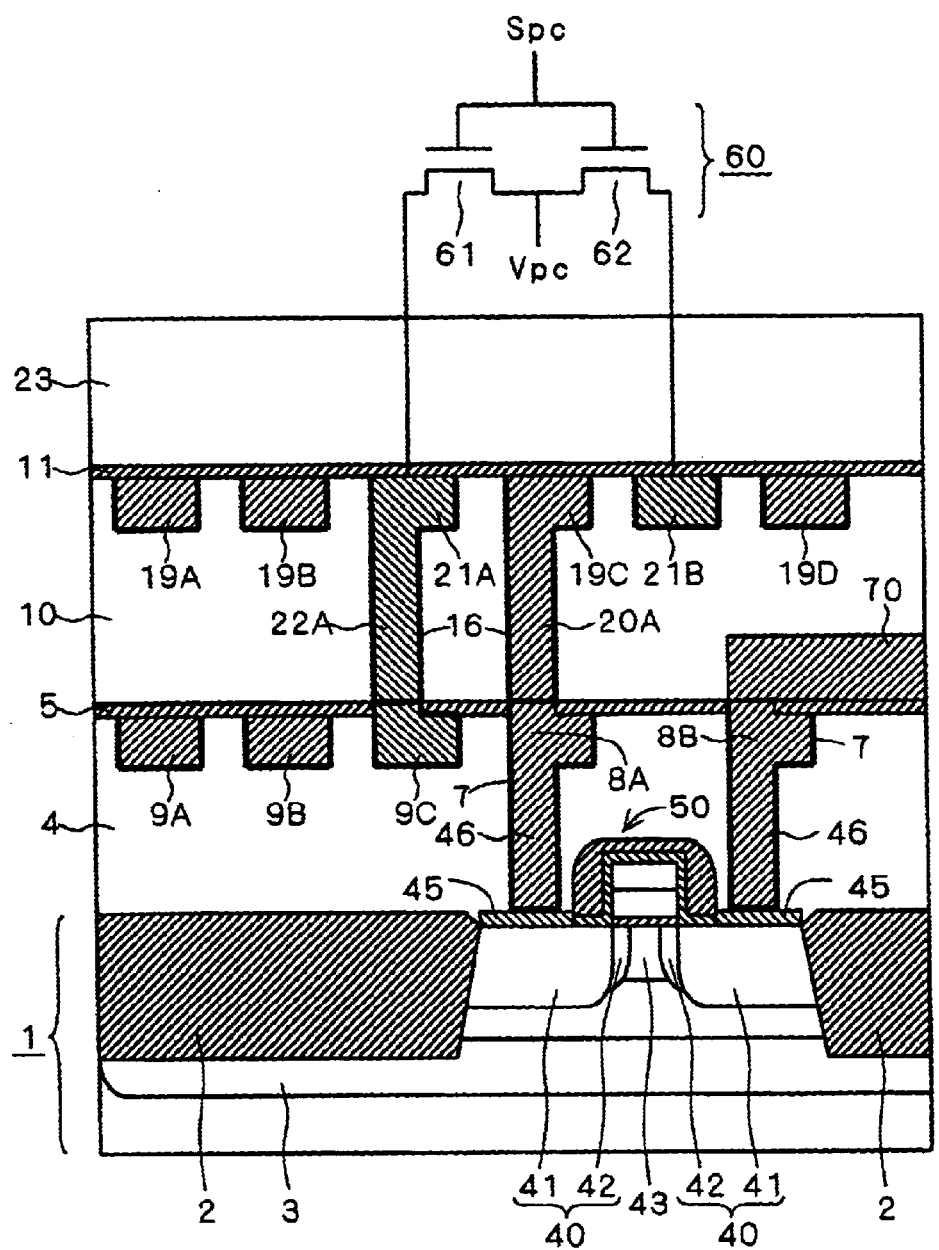

An example of the combination No. 14 is shown in FIG. 16. In FIG. 16, the dummy interconnections 21A and 21B are respectively connected to the source/drain electrodes of the MOSFETs 61 and 62 in the precharge circuit 60 provided in the semiconductor device. The precharge potential $V_{PC}$ is applied to the connection between the MOSFETs 61 and 62 and a precharge signal Spc is inputted to their gate electrodes. The interconnection 19C is a signal interconnection carrying a signal $V_{SIG}$.

Figure 17:
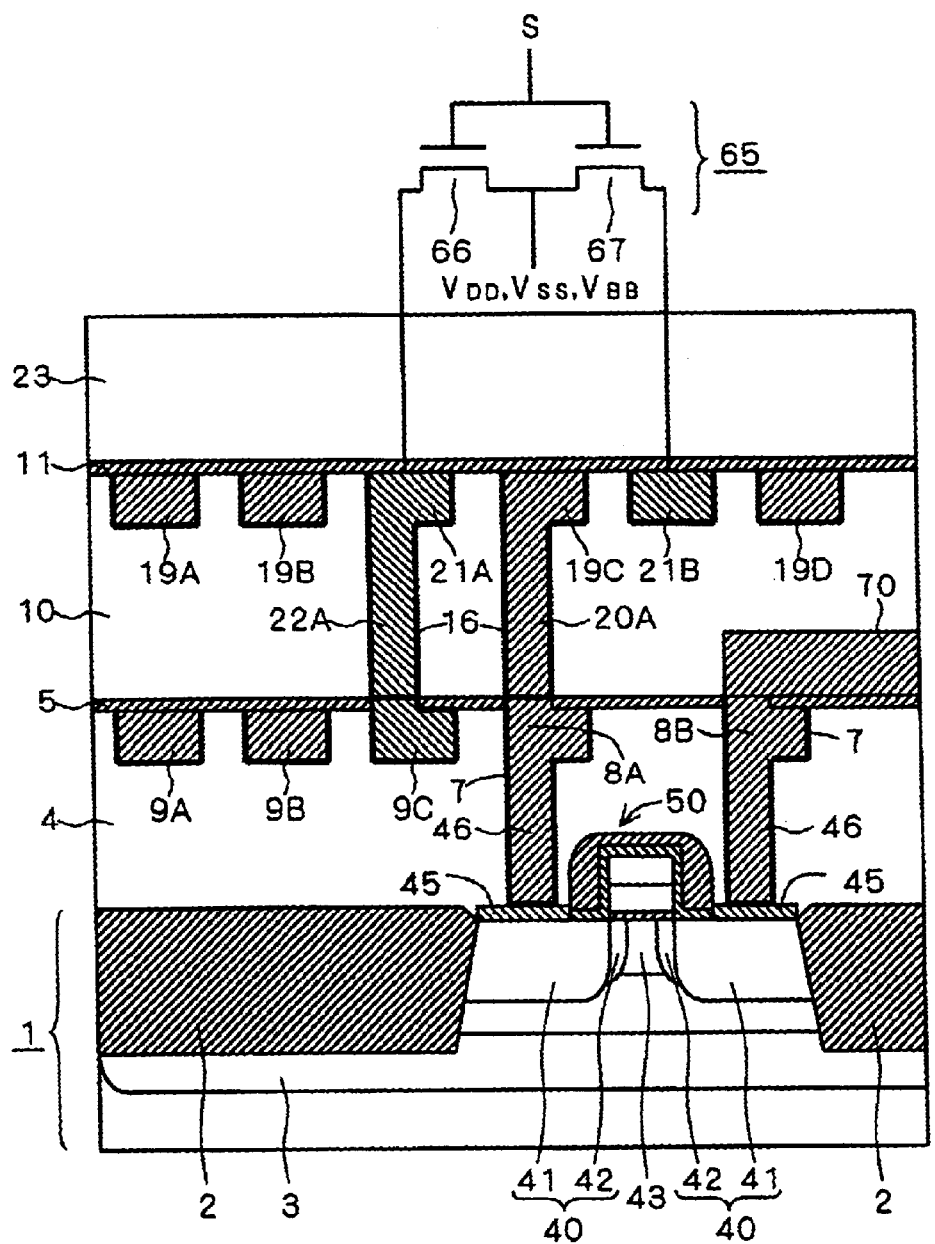

An example of the combinations Nos.13, 15 and 16 is shown in FIG. 17. In FIG. 17, the dummy interconnections 21A and 21B are respectively connected to the source/drain electrodes of the MOSFETs 66 and 67 included in the power-supply potential signal circuit 65 provided in the semiconductor device. The lower power-supply potential $V_{SS}$, higher power-supply potential $V_{DD}$, or substrate potential $V_{BB}$ is applied to the connection of the MOSFETs 66 and 67 and a power-supply potential signal S is inputted to their gate electrodes. The interconnection 19C is a signal line carrying a signal $V_{SIG}$.

3. Third Preferred Embodiment.

A semiconductor device according to a third preferred embodiment of the invention is characterized in that it is covered with a passivation film having a larger thermal conductivity than the interlayer insulating films or a heat sink or covered with both of them. This feature enhances the effect of cooling the interlayer insulating films.

When a high-frequency electromagnetic wave is propagated to an insulating film, molecules in the insulating film repeat polarization. Then the energy generated in polarization is converted into heat and the insulating film generates heat. This phenomenon is called dielectric loss, which is utilized in microwave ovens. When the operating frequency of the semiconductor device becomes as high as about hundreds of megahertz to several gigahertz, the beat generation due to the dielectric loss becomes more considerable than in conventional ones.

A temperature rise in the interlayer insulating film causes the following problems: (1) The thermal noise is increased. In high-frequency operation, the thermal noise is dominant over the 1/f noise. When the thermal noise is excessively large, it may cause malfunction especially in an analog circuit. (2) Metal atoms forming the interconnections diffuse or drift into the interlayer insulating film to deteriorate the insulating characteristic of the insulating film. (3) A temperature rise in a metal interconnection increases the resistance of the metal interconnection, which lowers the operating speed of the circuit. (4) The heat generated in the interlayer insulating film is transferred to the semiconductor substrate to increase the temperature of the semiconductor substrate (substrate temperature). This increases the phonon scattering probability of electrons or holes and the mobility decreases, which lowers the operating speed of the transistor.

At 273 K, $SiO_2$ (silicon dioxide) has a thermal conductance of 0.014 W/(cm.degree) and Cu has a thermal conductance of 4.01 W/(cm.degree). Heat is accumulated in the interlayer insulating film because of its extremely small thermal conductance. While an insulating film containing fluorine is an effective material in that it has a smaller relative dielectric constant than $SiO_2$ and so it reduces the interconnection capacitance. However, it is disadvantageous in that its thermal conductance is smaller than that of $SiO_2$, so that the substrate temperature becomes higher than in a conventional semiconductor device using $SiO_2$ as interlayer insulating film.

A conventional semiconductor device having no dummy interconnections and no dummy plugs had a problem that heat is accumulated in the interlayer insulating films and the substrate temperature rises. A conventional semiconductor device is therefore provided with a heat sink above the main surface of the semiconductor substrate or at the bottom thereof to remove heat generated in the interlayer insulating films for temperature reduction. In this case, the heat generated in the interlayer insulating filMsm is conducted to the heat sink where it can be dissipated. However, heat generated in the interlayer insulating films in which multi-layered interconnections are formed like meshes cannot be rapidly dissipated because of the low thermal conductance of the interlayer insulating films, so that it was difficult to suppress the substrate temperature sufficiently low.

In a semiconductor device of the third preferred embodiment of the invention, dummy interconnections and dummy plugs formed like meshes in the interlayer insulating films are utilized to promote conduction of heat generated in the interlayer insulating films to the top surface of the semiconductor device so as to enhance the efficiency of cooling the interlayer insulating films.

Figure 18:
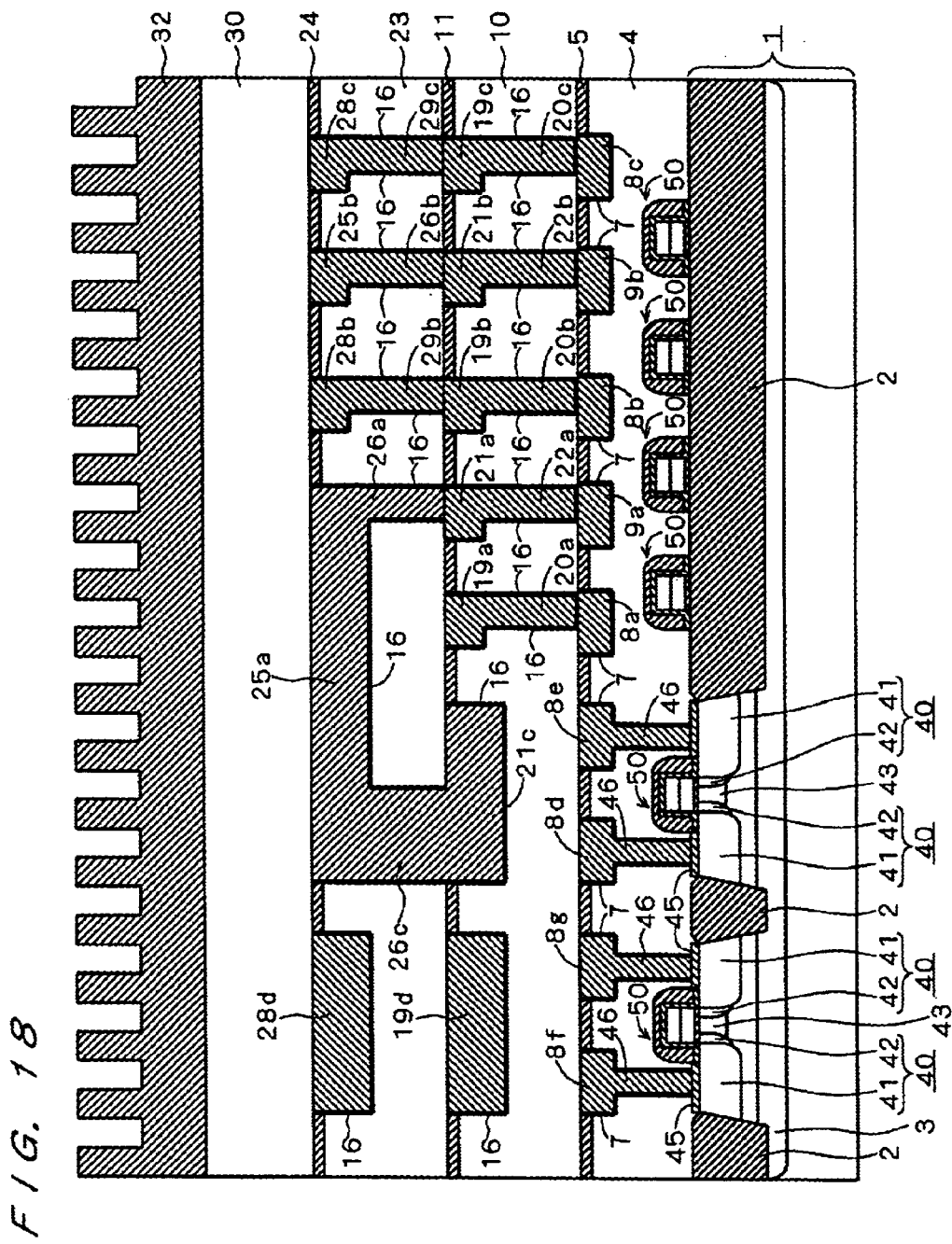
FIG. 18 is a sectional view showing an example of structure of a device according to a third preferred embodiment.

FIG. 18 is a sectional view showing the structure of a semiconductor device of the third preferred embodiment. The semiconductor device of FIG. 18 characteristically differs from the semiconductor device of the first preferred embodiment shown in FIG. 7 in that the passivation film 27 is replaced by a passivation film 30 having higher thermal conductivity and that it further comprises a heat sink 32. Specifically, the semiconductor device shown in FIG. 18 is characterized by the following points: (1) the dummy interconnections and dummy plugs are grounded, (2) the passivation film 30 provided between the uppermost-layer interconnections and the beat sink 32 has higher thermal conductivity than the interlayer insulating films 4, 10 and 23. While the semiconductor device of FIG. 18 has the heat sink 32 in contact with the passivation film 30, the presence of the passivation film 30 enables higher cooling effect than conventional semiconductor devices even in the absence of the heat sink 32.

Figure 19:
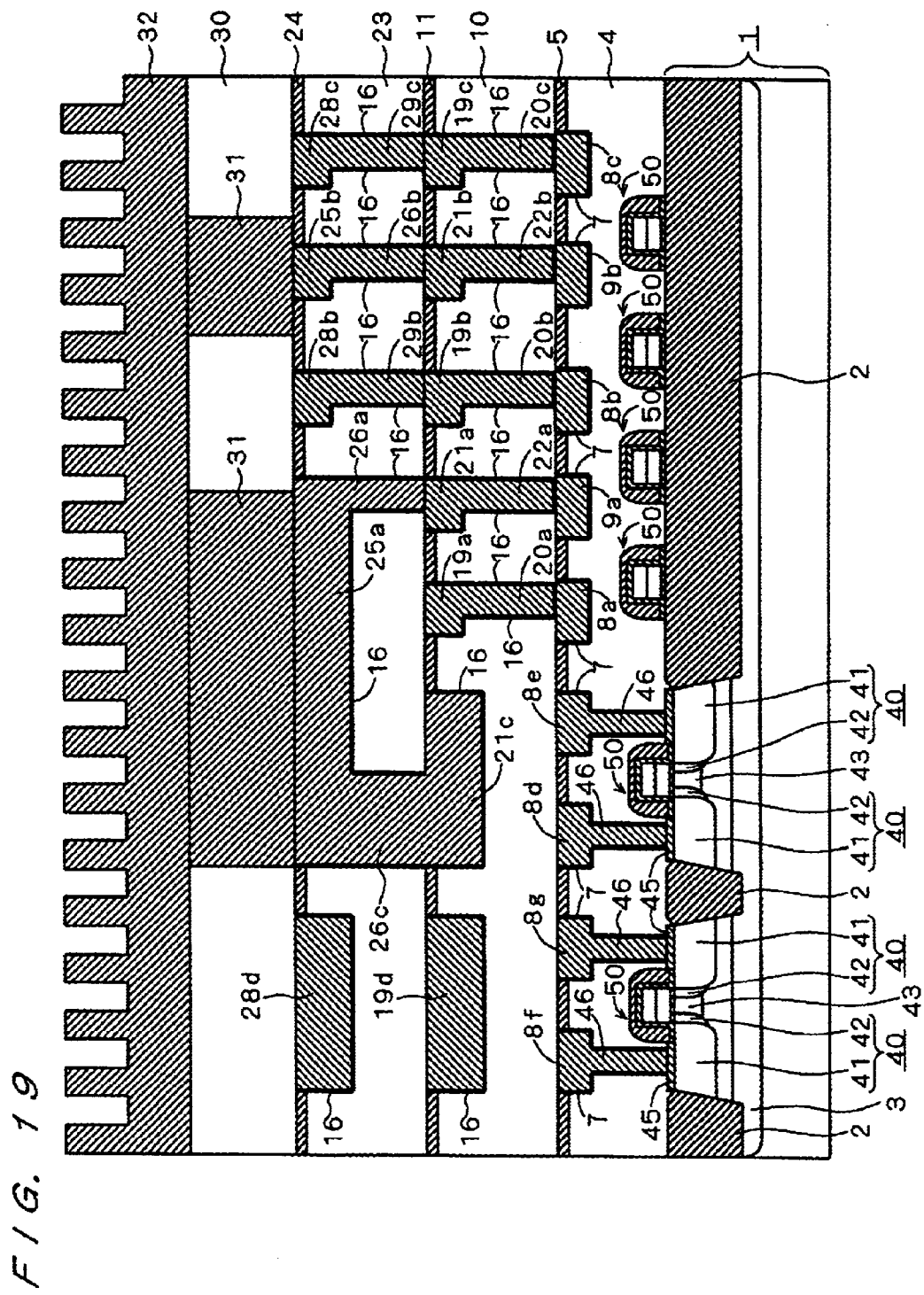
FIG. 19 is a sectional view showing another example of the structure of the device of the third preferred embodiment.

FIG. 19 is a sectional view showing the structure of another semiconductor device according to the third preferred embodiment. The semiconductor device of FIG. 19 is characterized by the following points: (1) the dummy interconnections and dummy plugs are grounded, and (2) plugs 31 are formed in part of the passivation film 30 and the heat sink 32 and the dummy interconnections in the uppermost layer are connected through the plugs 31.

Since the dummy interconnections and the dummy plugs are made of metal, they can efficiently transfer away the heat generated in the interlayer insulating films formed in contact with them to the heat sink 32. This device provides more satisfactory effect of cooling away the heat in the interlayer insulating films than conventional semiconductor devices having no dummy interconnections or dummy plugs, since metal has higher thermal conducting rate than the interlayer insulating films. This improves the circuit operation of the semiconductor device.

The dummy interconnections shown in FIGS. 18 and 19 may be formed into the plane configuration shown in FIG. 8 or the fin structure shown in FIG. 9. Adopting the fin structure increases the surface area of the dummy interconnections, which facilitates absorption of heat from the interlayer insulating film 23 into the dummy interconnection, thus further enhancing the cooling effect.

Alternatively, as shown in FIGS. 20 and 21, fins 201 may be formed not only in the direction along the main surface of the semiconductor substrate 1 but also in the direction vertical to the main surface in the sectional structure taken along the line A—A in FIG. 9. The fins 201 are a kind of dummy plugs connected to the dummy interconnection 25a. The presence of the fins 201 further enhances the cooling effect. While the fins 201 are not connected to the lower-layer dummy interconnection in FIG. 20, they are connected to the dummy interconnection 21a in the under layer in FIG. 21. In the example of FIG. 21, the heat conduction from the dummy interconnection 21a to the dummy interconnection 25a is facilitated, which further enhances the cooling effect.

The second reference discloses a semiconductor device in which a heat sink is provided over an interconnection located in the uppermost layer and a dummy interconnection in the uppermost layer is connected to the heat sink through a dummy plug. As stated in the first preferred embodiment however, the second reference does not disclose the technique of fixing the dummy conductors at a stable potential such as the ground potential. This reference does not disclose the fin structure, either.

4. Fourth Preferred Embodiment.

A semiconductor device according to a fourth preferred embodiment of the invention is characterized in that a dummy interconnection is connected to an STI or BOX layer (buried oxide layer) through a dummy plug. This feature effectively cools the STI or BOX layer.

Figure 22:
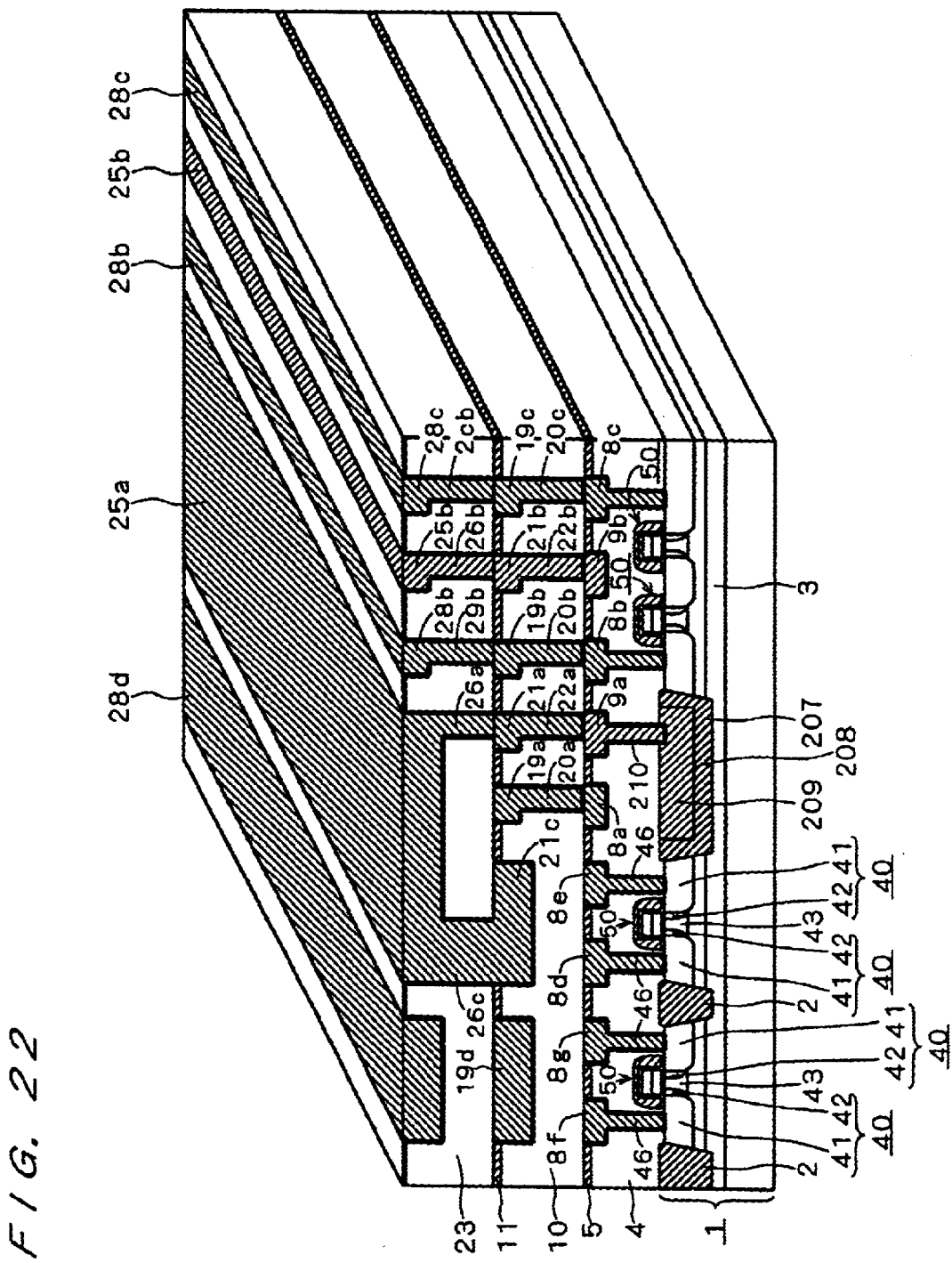
FIG. 22 is a sectional perspective view showing an example of structure of a device of a fourth preferred embodiment.

FIG. 22 is a cross-sectional perspective view showing the structure of a semiconductor device according to the fourth preferred embodiment. The semiconductor device of FIG. 22 characteristically differs from the semiconductor device of the first preferred embodiment shown in FIG. 7 in that a trench is formed in the upper part of the STI 207, one of the STIs 2, and an electrically conductive layer 209 is buried in this trench with a barrier metal 208 therebetween; this conductive layer 209 is connected to the dummy interconnection 9a through the dummy plug 210.

In formation of the characteristic structure in the semiconductor device of FIG. 22, first, the upper part of the STI 207 formed in the main surface of the semiconductor substrate 1 is selectively removed by etching to form a trench. Subsequently the barrier metal 208 is formed on the sides and bottom of the trench. Next the trench is filled with metal to form the dummy conductive layer 209. In the following process steps, the metal layer 209 is connected to the dummy interconnection 9a through the dummy plug 210 and further to the dummy interconnections in the upper layers. Thus, the conductive layer 209 is finally connected to the dummy interconnection 25a located in the uppermost layer through the dummy plugs and dummy interconnections made of metal.

In the semiconductor substrate of FIG. 22 thus constructed, the heat accumulated in the STI 207 can be efficiently removed. Further, since the conductive layer 209 is grounded through the dummy interconnection 25a, the MOSFETs separated by the STI 207 can be shielded from each other to more effectively suppress the interference. When the heat sink 32 is provided over the dummy interconnection 25a as shown in FIG. 18 or FIG. 19, then the effect of cooling the STI 207 is further enhanced.

Figure 23:
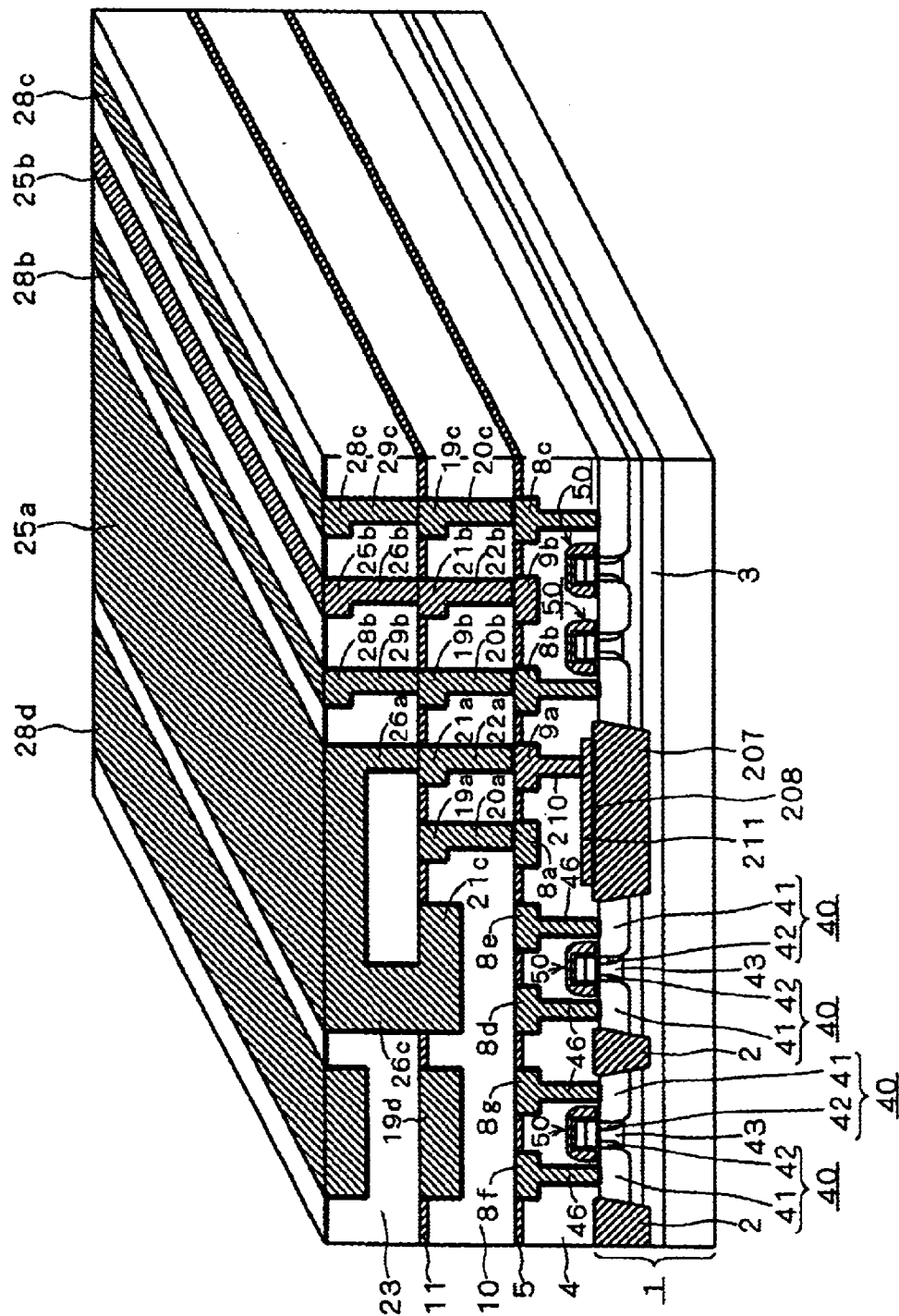
FIGS. 23 and 24 are sectional perspective views showing other examples of the structure of the device of the fourth preferred embodiment.

As shown in FIG. 23, a conductive layer 211 may be formed as a dummy interconnection layer on the upper surface of the STI 207, without a trench formed in the STI 207, and connected to the dummy plug 210. Like the structure of FIG. 22, this structure can efficiently dissipate heat accumulated in the STI 207 and provide an improved effect of shielding isolated MOSFETs from each other.

Figure 24:
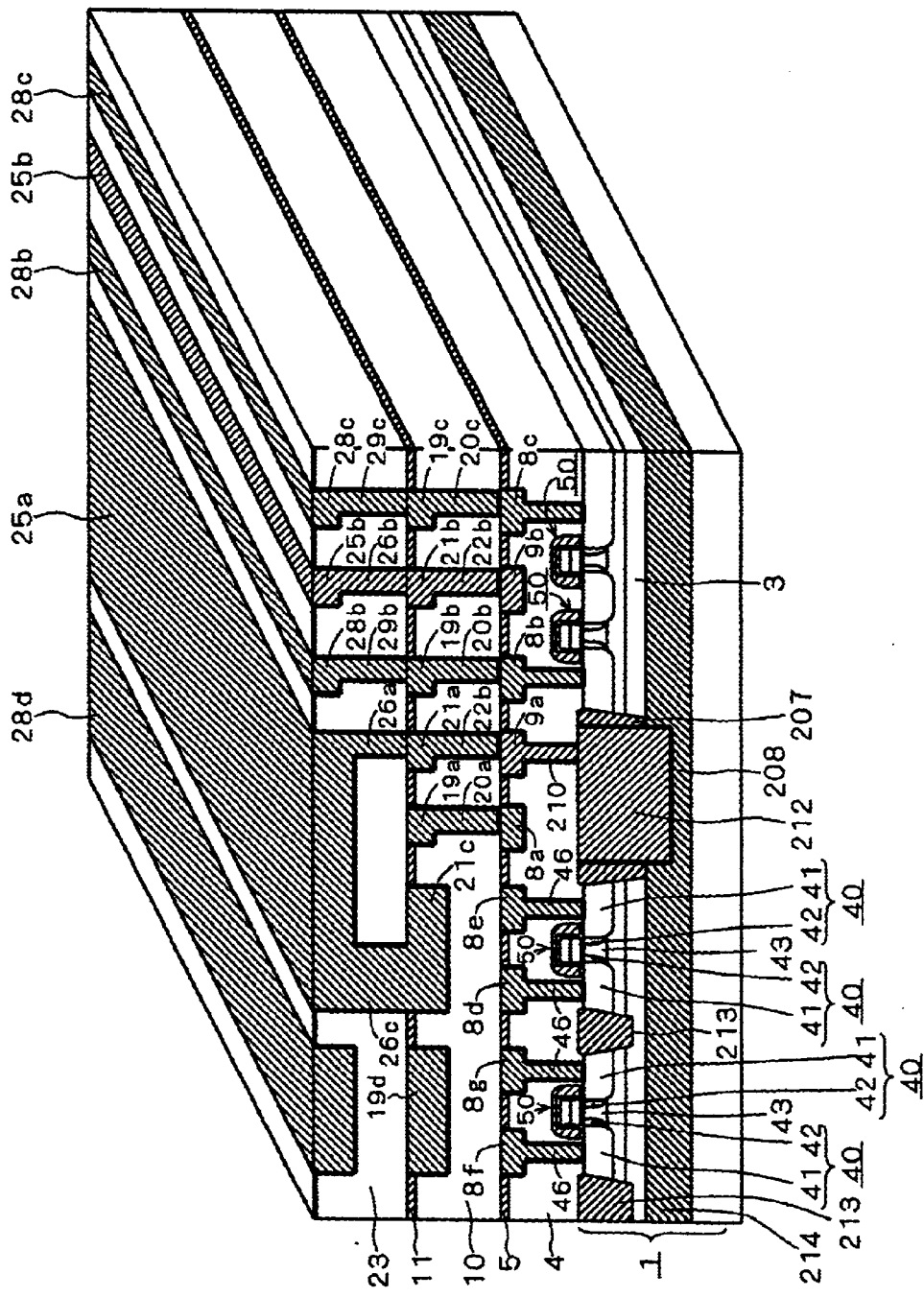

FIG. 24 is a cross-sectional perspective view showing another example of the semiconductor device of the fourth preferred embodiment. In the semiconductor device of FIG. 24, the semiconductor substrate 1 is formed as an SOI (Silicon On Insulator) substrate having a BOX 214. The element isolation structure includes PTIs (Partial Trench Isolations) 213, which are STIs whose bottom does not reach the BOX 214, and the STI 207 reaching the BOX 214. The BOX 214 can be formed as a buried insulating layer made of any one of general insulating materials.

A conductive layer 212 is buried in a trench extending from the upper surface of the STI 207 to the bottom to reach the BOX 214 with a barrier metal 208 interposed therebetween. The conductive layer 212 is connected to the dummy plug 210.

In formation of this characteristic structure, first, a trench is formed in the STI 207 formed in the main surface of the semiconductor substrate 1 and in the BOX layer 214. Then the barrier metal 208 is formed on the sides and bottom of the trench. Next, the trench is filled with metal to form the dummy conductive layer 212. The conductive layer 212 is grounded through dummy interconnections and dummy plugs. In the following process steps, the metal layer 212 is connected to the dummy interconnection 9a through the dummy plug 210 and further to the dummy interconnections in the upper layers. Thus the conductive layer 212 is finally connected to the dummy interconnection 25a in the uppermost layer through the dummy plugs and dummy interconnections made of metal.

In the semiconductor substrate of FIG. 24 thus constructed, heat accumulated in the STI 207 and the BOX 214 can be efficiently removed. Further, the conductive layer 212 is grounded through the dummy interconnection 25a, which provides an improved effect of shielding the MOSFETs separated by the STI 207 from each other.

Thus effectively shielding the isolated MOSFETs from each other suppresses the short-channel characteristic, the reverse short-channel characteristic, narrow-channel characteristic, and reverse narrow-channel characteristic due to interference between the internal electric fields in the MOSFETs. This applies also to the structures shown in FIGS. 22 and 23.

Figure 25:
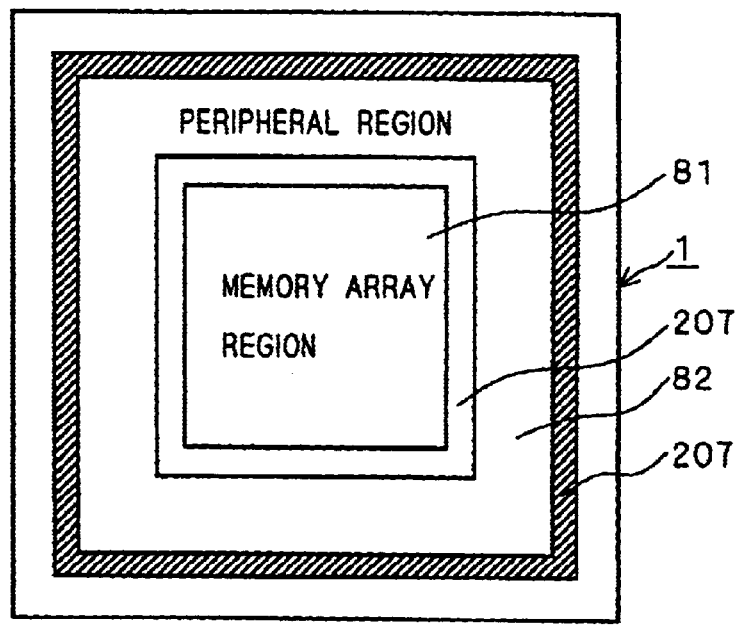
FIGS. 25 and 26 are plans showing examples of applications of the device of the fourth preferred embodiment.
Figure 26:
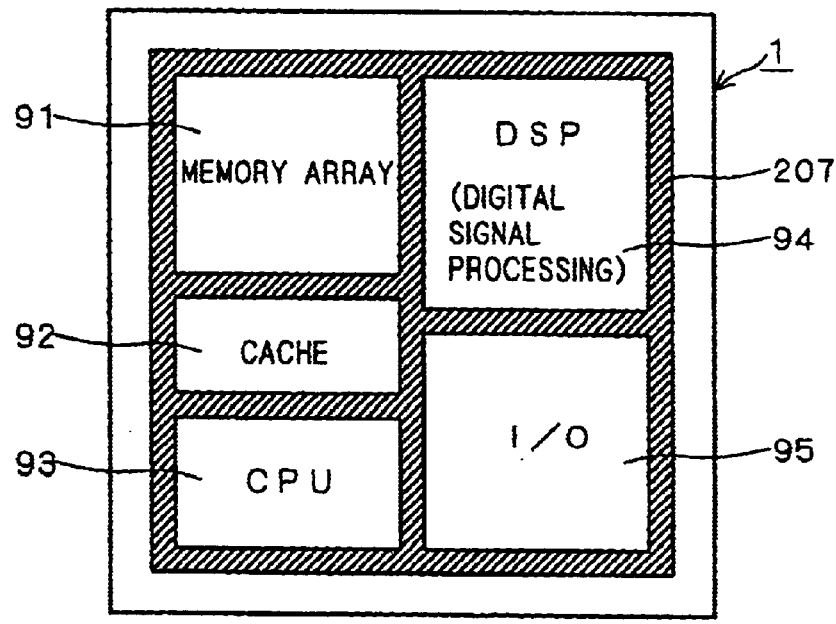
Figure 27:
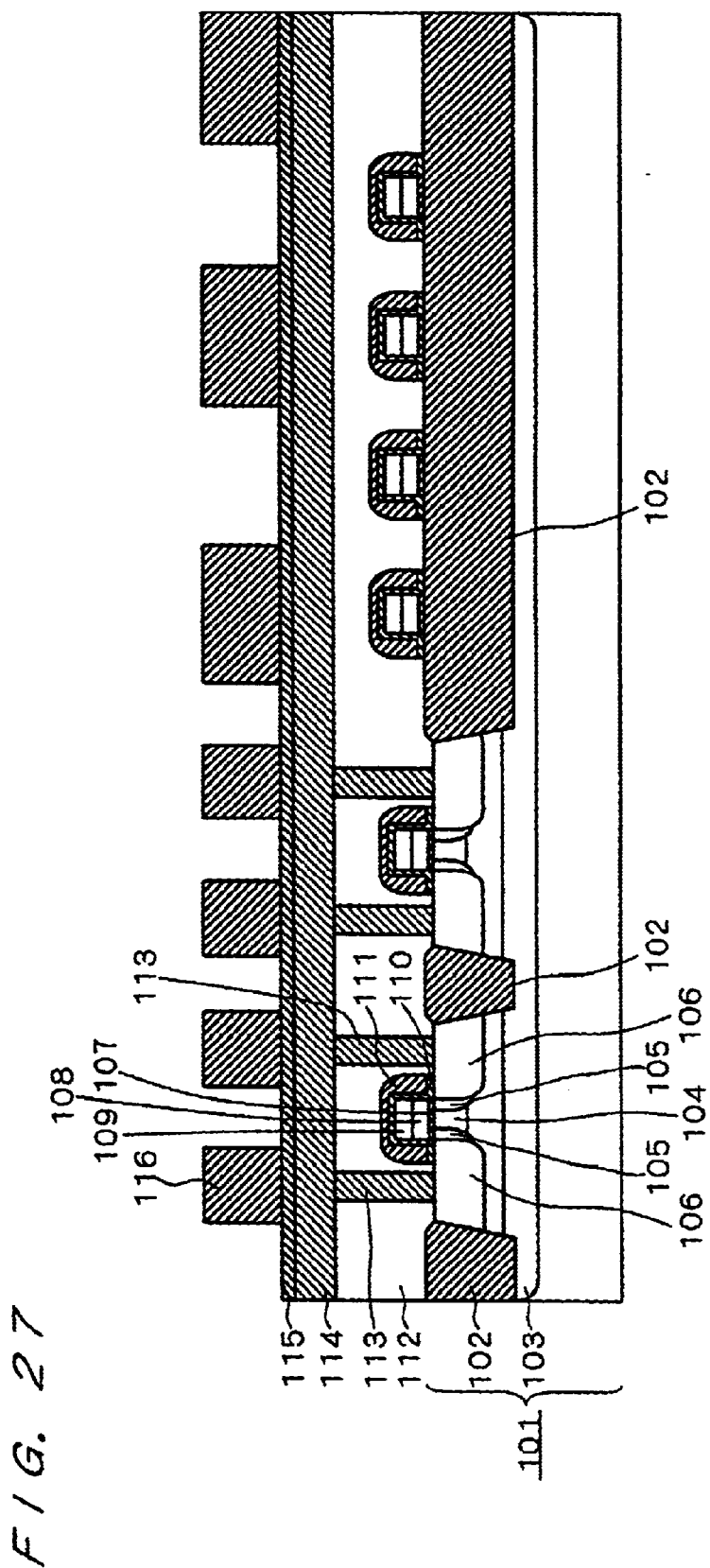
FIGS. 27 to 29 are sectional views showing the structure of a first conventional device.
Figure 28:
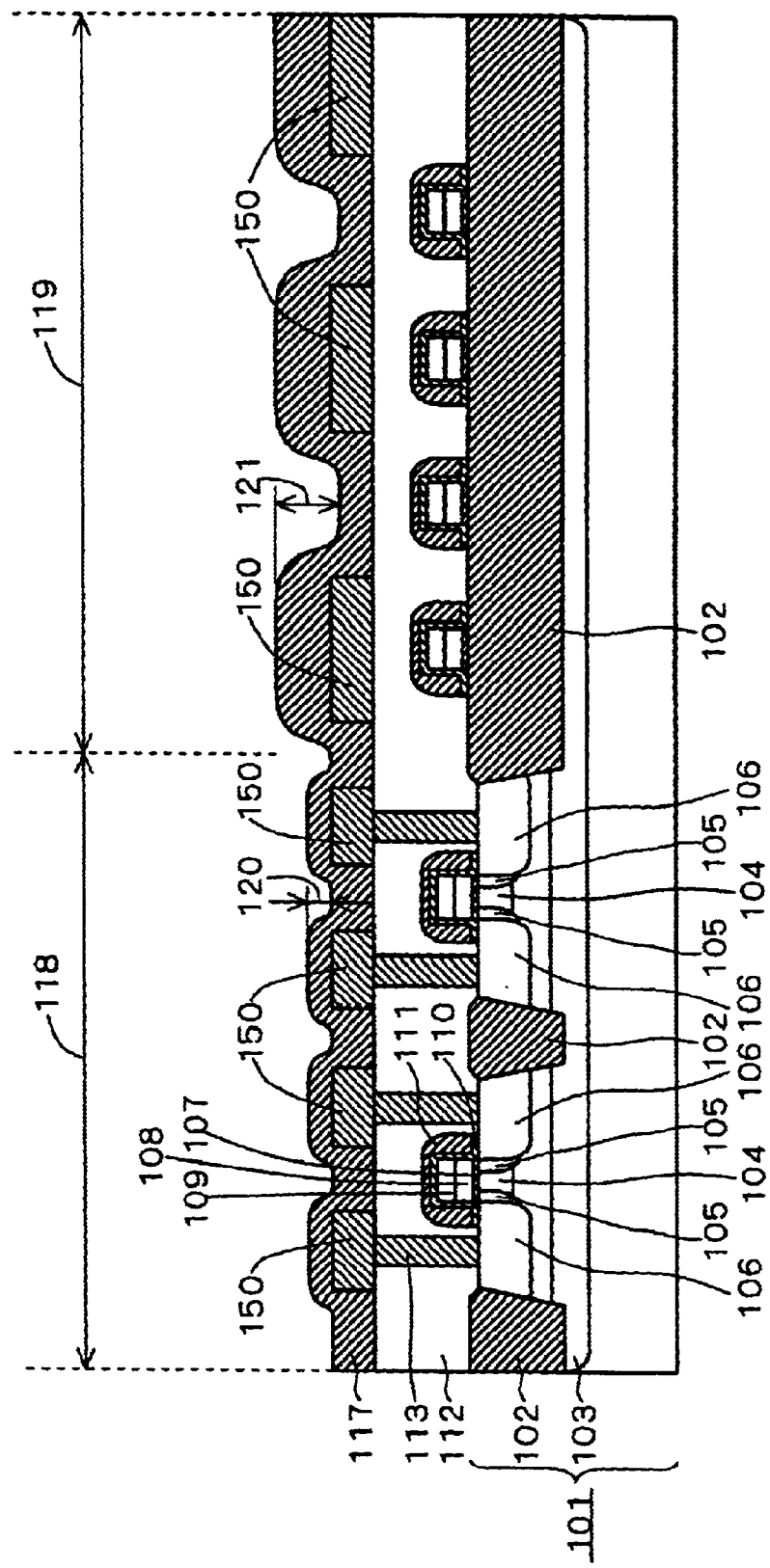
Figure 29:
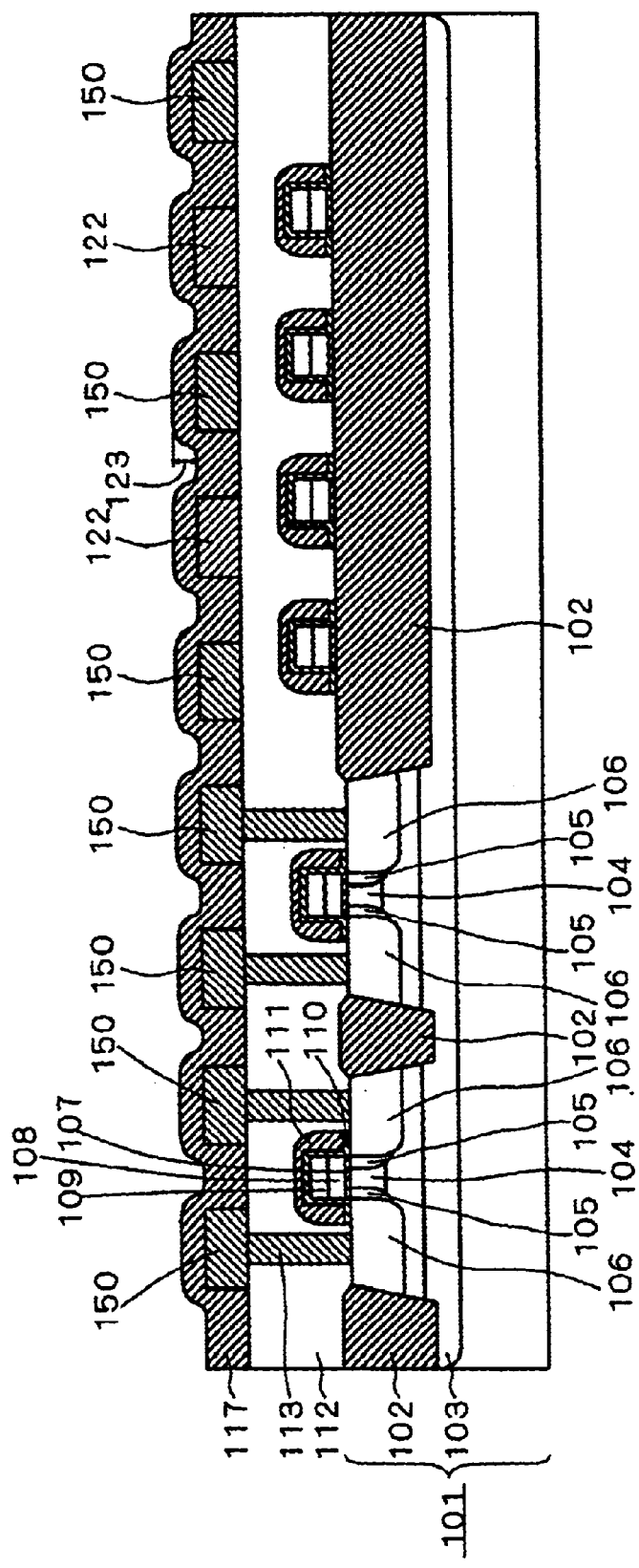
Figure 30:
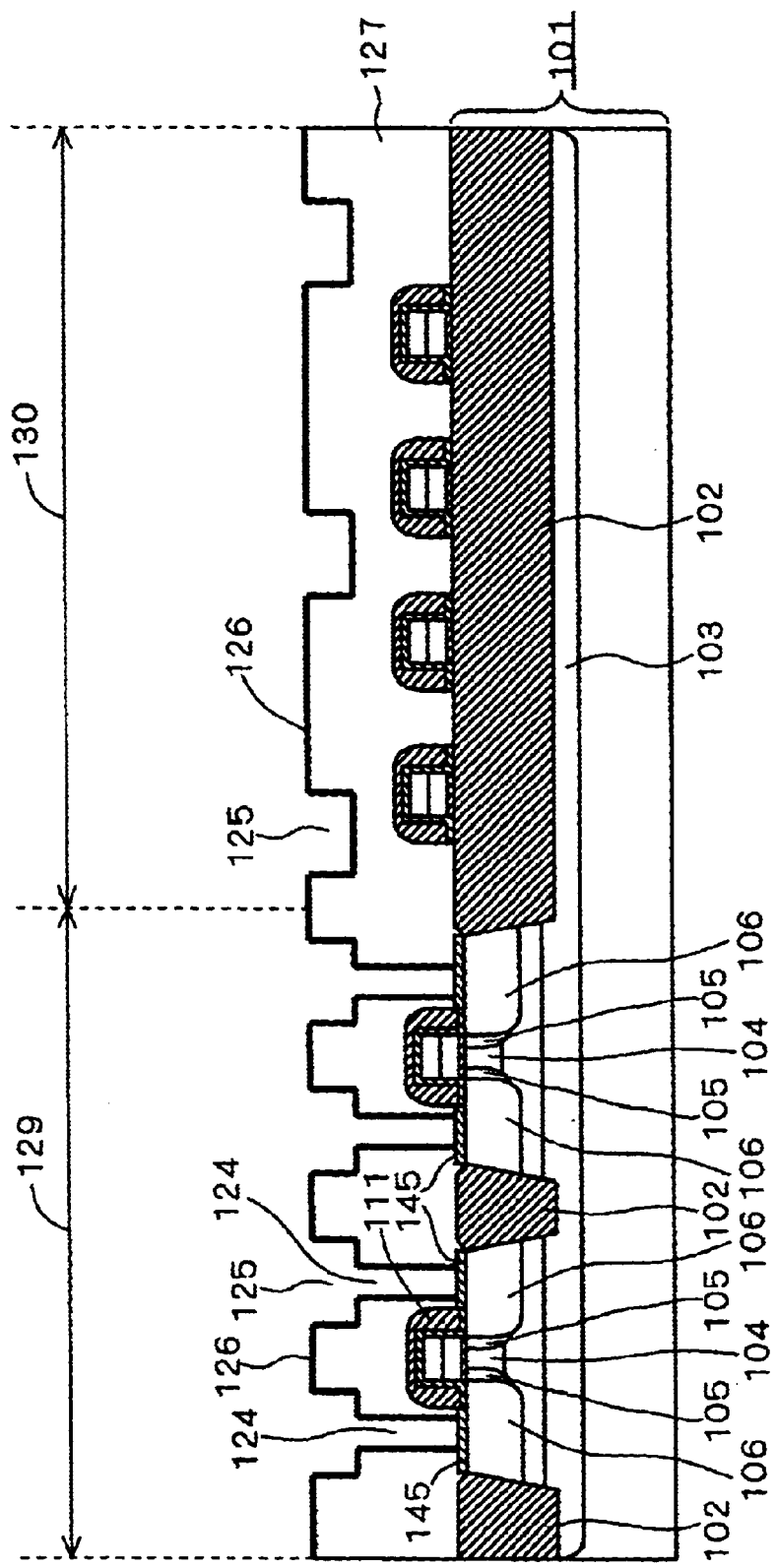
FIGS. 30 to 36 are sectional views showing the structure of a second conventional device.
Figure 31:
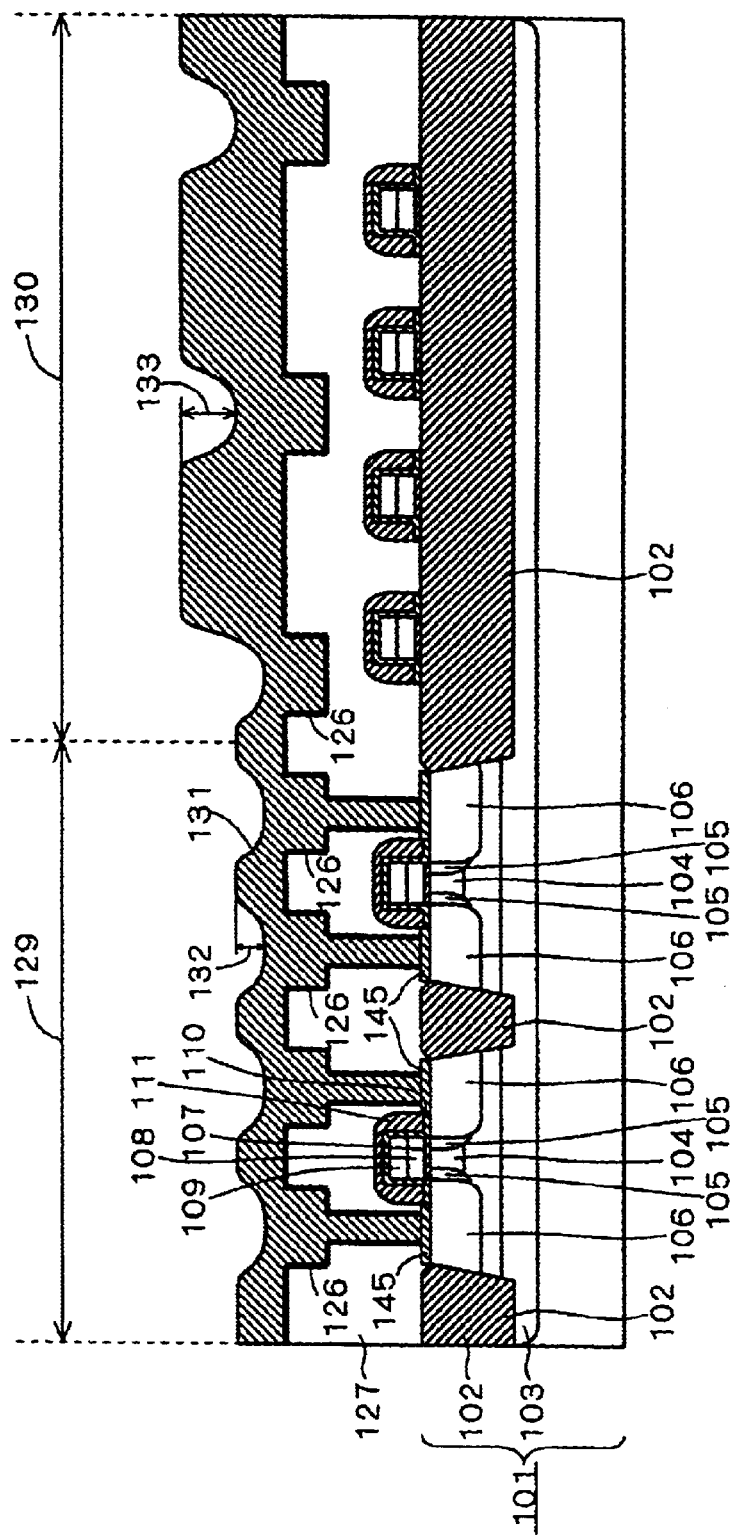
Figure 32:
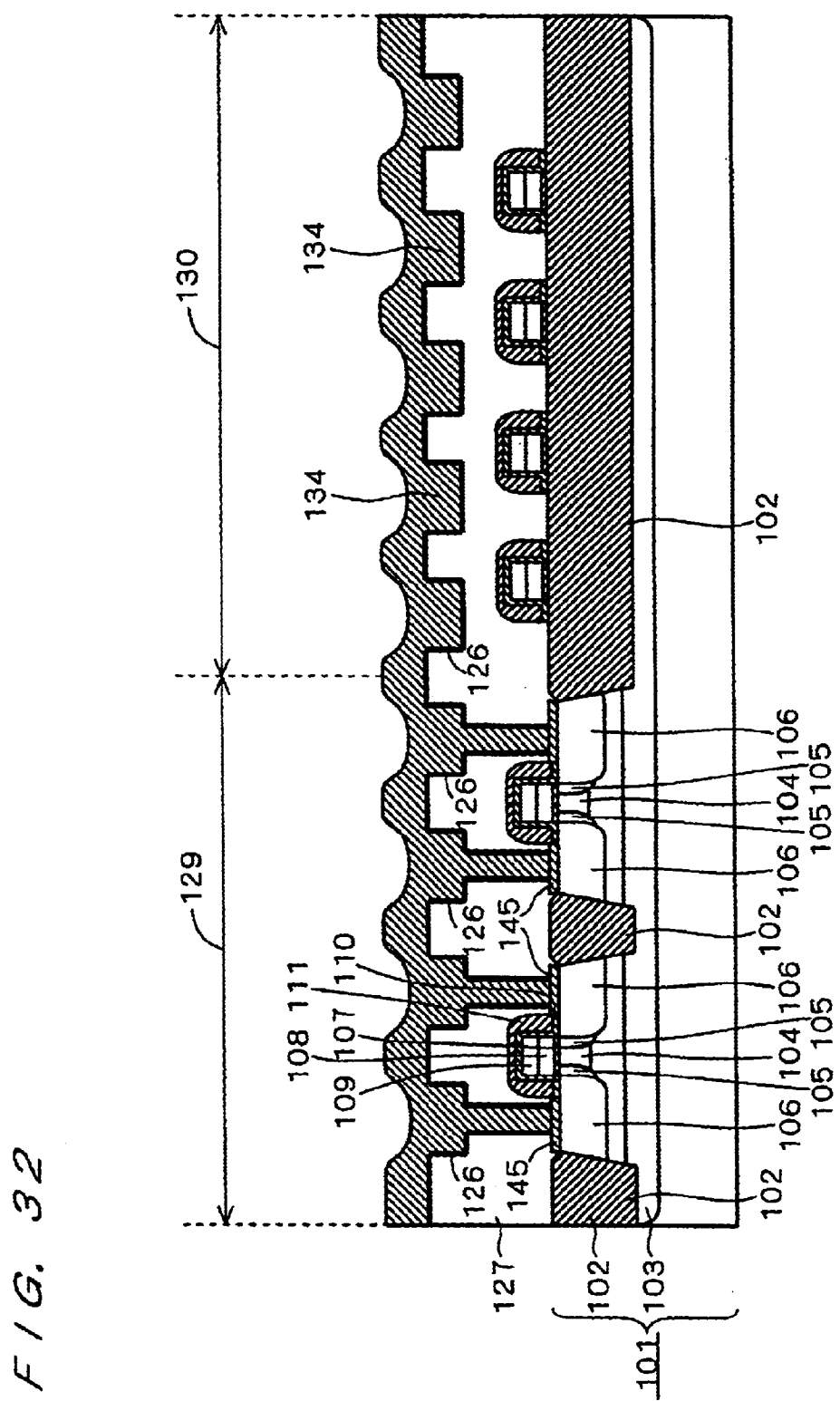
Figure 33:
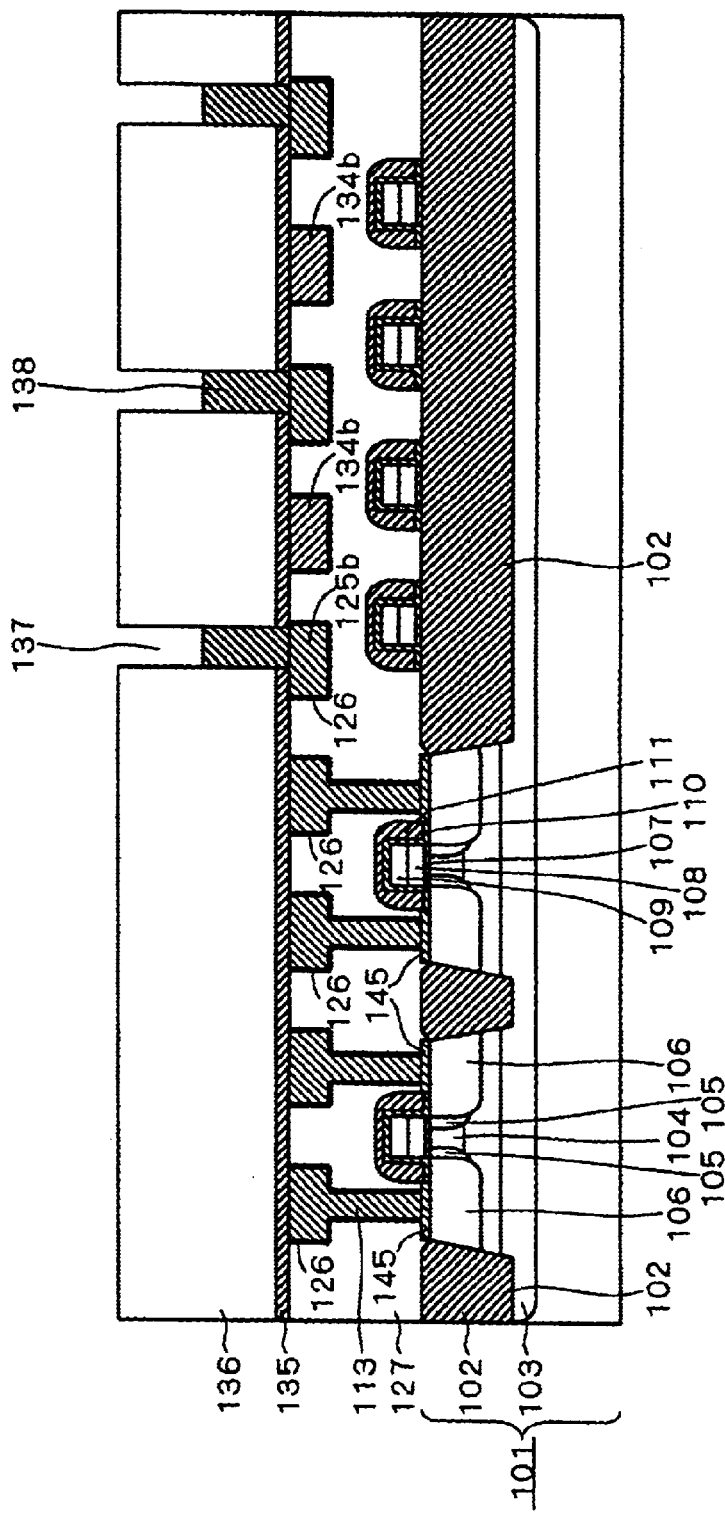
Figure 34:
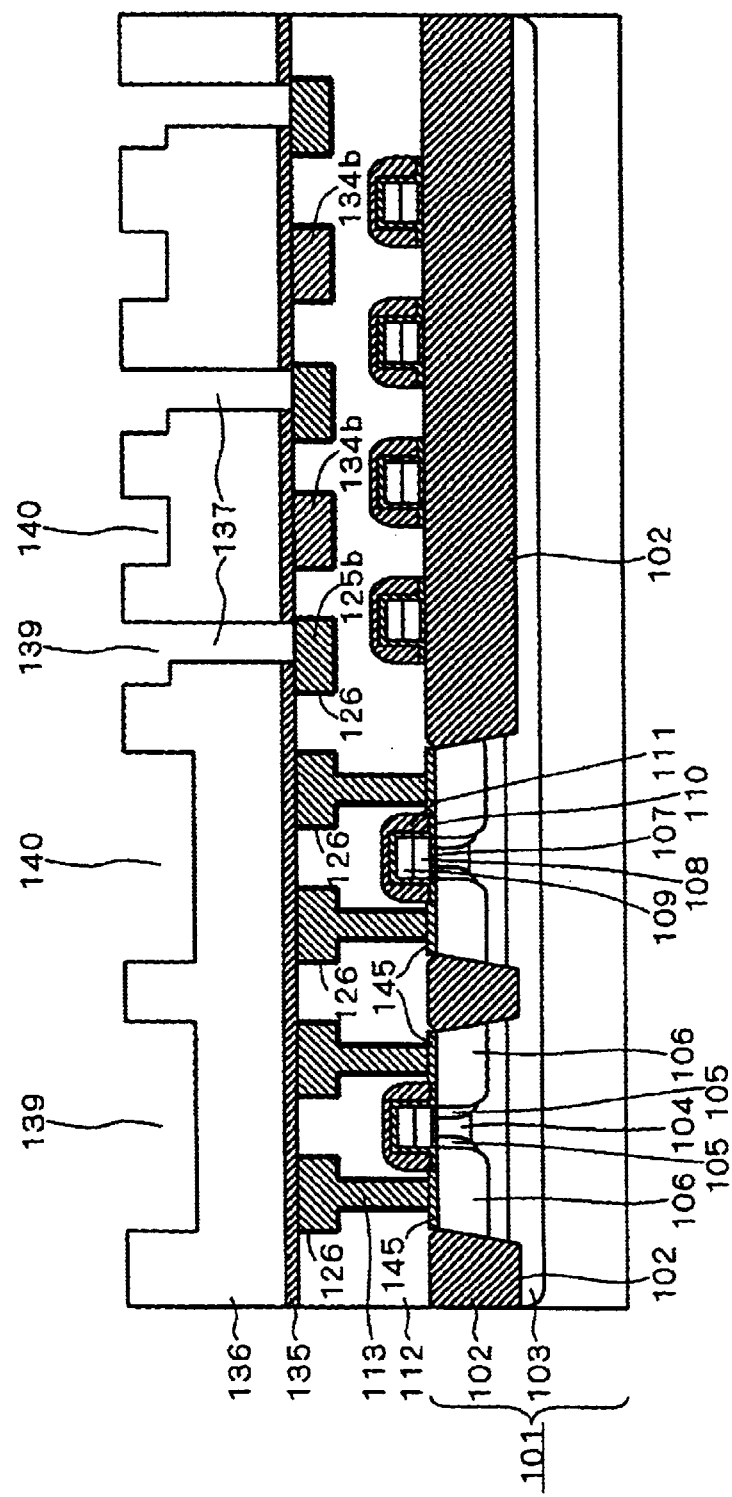
Figure 35:
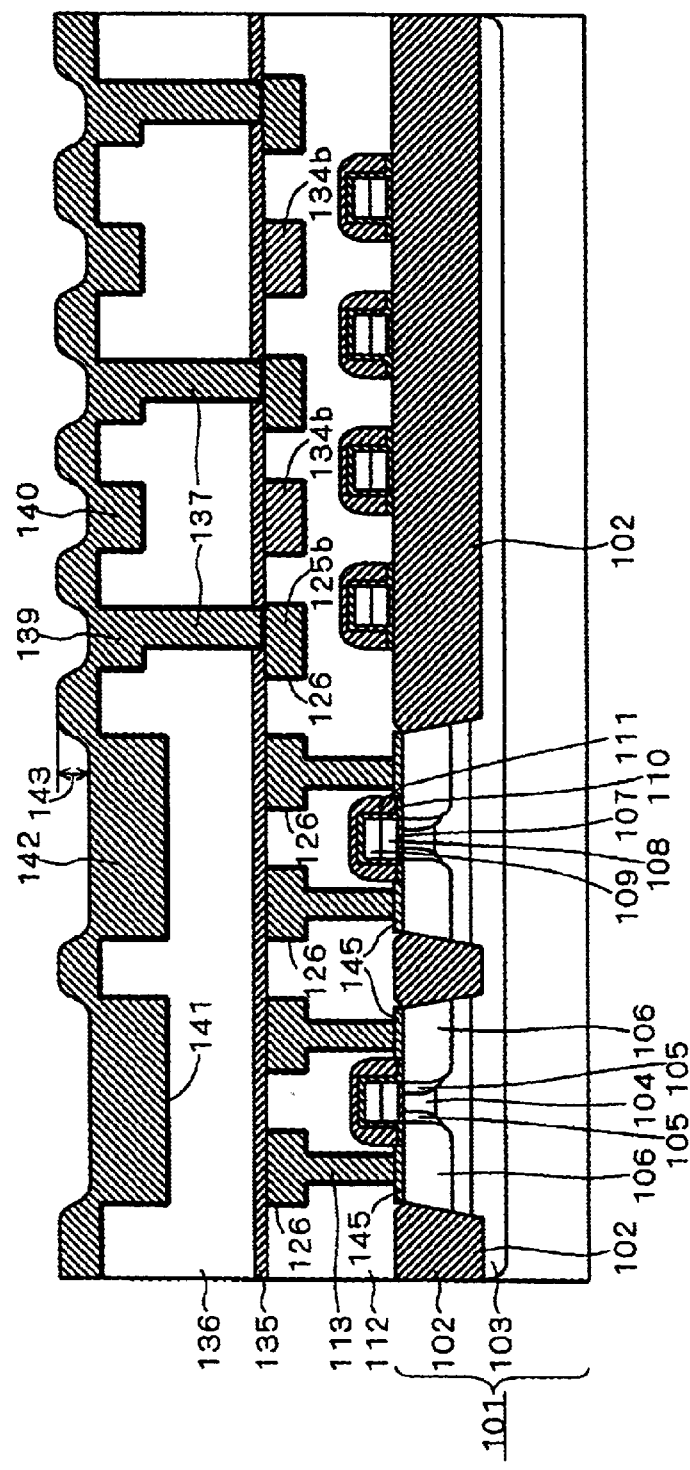
Figure 36:
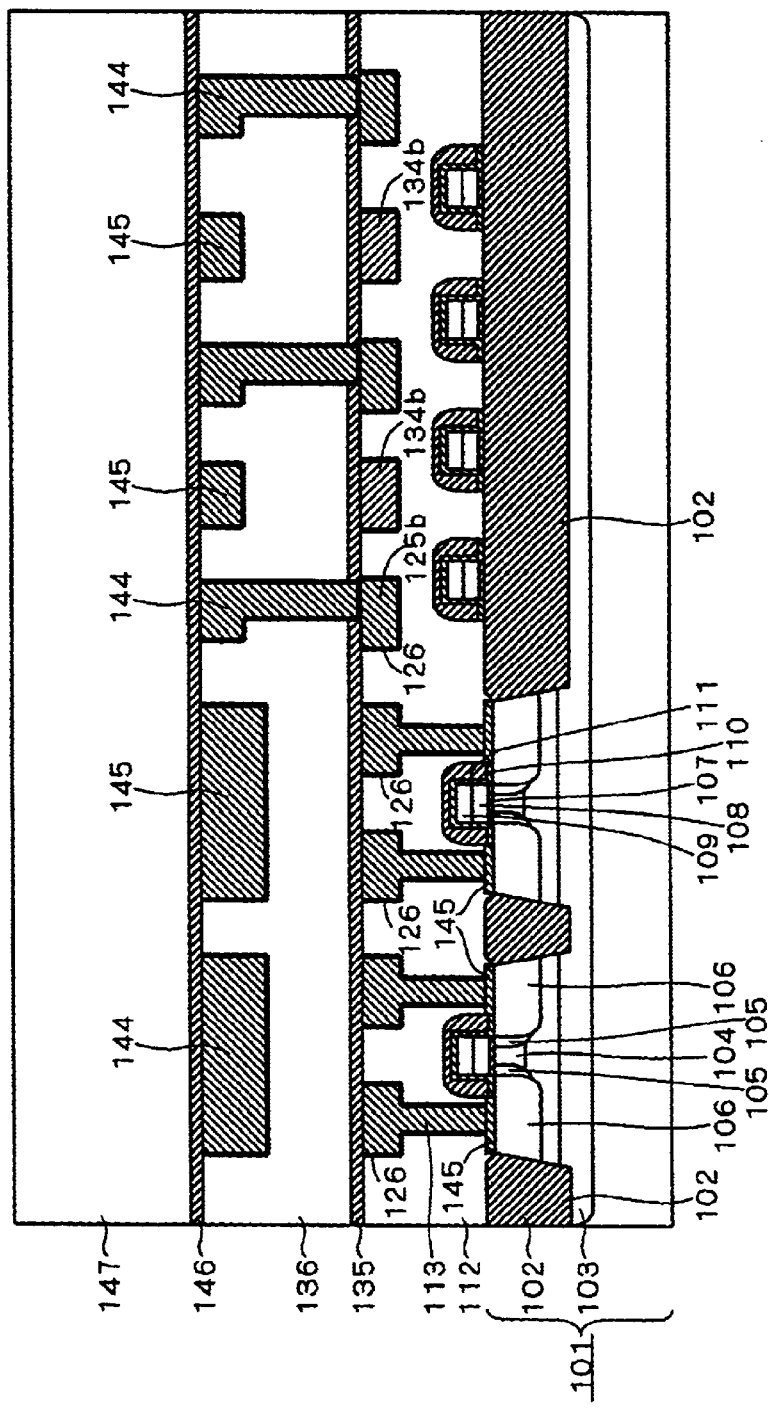

FIGS. 25 and 26 are plane views showing applications of the shielded STI 207. The shielded STI 207 means an STI 207 having any of the conductive layers 209, 211 and 212 and in which the conductive layer is grounded (or fixed at a stable potential).

The semiconductor substrate 1 shown in FIG. 25 has, as functional blocks, a memory array region 81 in which a memory array is arranged and a peripheral region 82 in which peripheral circuits are formed, which are isolated by the STI 207. The memory cell array region 81 in which small signals are carried on bit lines is thus isolated from the peripheral region 82 by the shield STI 207, which suppresses noise superimposed on the signals carried on the bit lines connected to sense amplifiers. This improves the S/N ratio. Further, heat accumulated in the STI 207 or BOX 214 can be efficiently dissipated in chip size.

The semiconductor substrate 1 shown in FIG. 26 has a memory array 91, cache memory 92, CPU 93, DSP (Digital Signal Processing) 94, and input/output interface 95 formed therein. That is, FIG. 26 shows an example of a system LSI. These functional blocks are isolated from each other by the shield STI 207. The functional blocks are thus shielded and heat accumulated in the STI 207 and BOX 214 can be effectively dissipated in chip size.

5. Modifications.

The first to fourth preferred embodiments have described examples using a silicon substrate. However, the substrate is not limited to the silicon substrate. Needless to say, the invention can be applied also to semiconductor substrates having a semiconductor other than silicon as a base material, or to SOI (Silicon On Insulator) substrates like that shown in the fourth preferred embodiment.

The present invention can be applied to semiconductor devices such as DRAMs (Dynamic Random Access Memories), SRAMs (Static Random Access Memories), EEPROMs (Electrically Erasable Programmable Read Only Memories), logic circuits, etc. Further, needless to say, the invention can also be applied to semiconductor devices in which such components are mixed.

In the drawings used in the description above, the interconnections, plugs, dummy interconnections, and dummy plugs are schematically represented as having rectangular shape in section. However, these elements are not always finished in rectangular form; they may be tapered, or rounded or dented particularly at corners by means of effects peculiar to the etching process or transfer process including modified illumination, proximity effect correction and lens aberration correction. The effects described in the preferred embodiments are effective also to such dummy interconnections and dummy plugs having tapered, rounded, dented or other forms, and it is a matter of course that they fall within the scope of the invention as technical ideas.

6. Meanings of the terms.

The term "dummy interconnection" is a concept which is widely used in this field of art and is so clear a term for those having ordinary skill in the art as to need no specific definition here. As is clear from the description, "dummy interconnection" in this field of art can be represented as follows. A dummy interconnection is an interconnection which is not directly related to the circuit operation of the semiconductor device and whether they are present or absent makes no difference on the circuit diagram of the semiconductor device. However, the dummy interconnections are provided in interconnection layers in which interconnections which contribute directly to the circuit operation are formed, so as to enhance the uniformity of the interconnection density in the interconnection layers. Accordingly the shape of the dummy interconnections is not limited to those disclosed in this specification, but they can be formed in any geometric shape. The "dummy plug" can be represented as a plug connected to the dummy interconnections. Even if a dummy interconnection is fixed at a ground potential etc., the dummy interconnection is clearly distinguishable for those having ordinary skill in the art from interconnections carrying the ground potential etc. to semiconductor elements like MOSFETs.

While the invention has been described in detail, the foregoing description is in all aspects illustrative and not restrictive. It is understood that numerous other modifications and variations can be devised without departing from the scope of the invention.

What is claimed is:

1. A semiconductor device comprising:

a semiconductor substrate having a main surface along which a semiconductor element is formed;

interlayer insulating films formed on said main surface;

conductive interconnections provided in a plurality of layers separated by said interlayer insulating films;

conductive dummy interconnections provided in the plurality of layers so that every one of said conductive dummy interconnections is formed in a layer of said plurality of layers with at least one conductive interconnection; and a conductive dummy plug selectively buried in said interlayer insulating films to connect said dummy interconnections between said two or more layers and connected together with said dummy interconnections to a stable potential line which is included in said interconnections and which holds a constant potential with respect to a potential carried on a lower-potential power-supply line or a higher-potential power-supply line, wherein said dummy interconnections are provided to sandwich an interconnection part included in said interconnections in at least one layer of said plurality of layers, and wherein said dummy interconnections also comprise a dummy interconnection which is provided in a layer located over said at least one layer to cover said interconnection part.

2. The semiconductor device according to claim 1, wherein said stable potential line is any of said lower-potential power-supply line, said higher-potential power-supply line, a precharge line included in said interconnections and carrying a precharge potential, and a substrate potential line included in said interconnections and carrying a substrate potential.

3. The semiconductor device according to claim 1, further comprising a passivation film converting the uppermost layer among said plurality of layers and having a higher thermal conductivity than said interlayer insulating films.

4. The semiconductor device according to claim 3, further comprising a heat sink which is in contact with said passivation film.

5. The semiconductor device according to claim 4, wherein said dummy interconnections also comprise one which is provided in said uppermost layer, and said semiconductor device further comprises another conductive dummy plug selectively buried in said passivation film to connect said heat sink and part of said dummy interconnection which belongs to said uppermost layer.

6. A semiconductor device comprising:

a semiconductor substrate having a main surface along which a semiconductor element is formed;

interlayer insulating films formed on said main surface;

conductive interconnections provided in a plurality of layers separated by said interlayer insulating films; and conductive dummy interconnections provided in the same layers as said interconnections in two or more layers included in said plurality of layers, wherein at least one of said dummy interconnections has repetitive protrusions and recesses along its elongate direction in a section taken along said main surface.

7. The semiconductor device according to claim 6, wherein potentials corresponding to each of said lower-potential power-supply line or a higher-potential power-supply line are connected to said dummy conductive plug.

8. The semiconductor device according to claim 6, comprising:

a conductive dummy plug selectively buried in said interlayer insulating films to connect said dummy interconnections between said two or more layers and connected together with said dummy interconnections to a stable potential line which is included in said interconnections and which holds a constant potential with respect to a potential carried on a lower-potential power-supply line or a higher-potential power-supply line.

9. A semiconductor device comprising:

a semiconductor substrate having a main surface along which a semiconductor element is formed;

interlayer insulating films formed on said main surface;

conductive interconnections provided in a plurality of layers separated by said interlayer insulating films; and conductive dummy interconnections provided in the same layers as said interconnections in two or more layers included in said plurality of layers, wherein at least one of said dummy interconnections has repetitive protrusions and recesses along its elongate direction in a section taken along a plane perpendicular to said main surface.

10. The semiconductor device according to claim 9, wherein the protrusions among said repetitive protrusions and recesses are connected to a part of said dummy interconnection provided in a lower layer.

11. The semiconductor device according to claim 9, comprising:

a conductive dummy plug selectively buried in said interlayer insulating films to connect said dummy interconnections between said two or more layers and connected together with said dummy interconnections to a stable potential line which is included in said interconnections and which holds a constant potential with respect to a potential carried on a lower-potential power-supply line or a higher-potential power-supply line.

* * * * *